(12) United States Patent
Kim et al.

(10) Patent No.: US 12,373,050 B2
(45) Date of Patent: Jul. 29, 2025

(54) TOUCH DISPLAY DEVICE, DISPLAY PANEL, AND GATE DRIVING CIRCUIT

(71) Applicant: LG Display Co., Ltd., Seoul (KR)

(72) Inventors: Byoungwoo Kim, Paju-si (KR); JoonHo Lee, Paju-si (KR); HyunHo Park, Paju-si (KR); Sunghoon Paik, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/195,144

(22) Filed: May 9, 2023

(65) Prior Publication Data

US 2023/0367410 A1    Nov. 16, 2023

(30) Foreign Application Priority Data

May 13, 2022    (KR) .................. 10-2022-0059168

(51) Int. Cl.
*G09G 3/3266* (2016.01)
*G06F 3/041* (2006.01)
*G09G 3/20* (2006.01)
*G09G 3/3225* (2016.01)
*G09G 3/36* (2006.01)
*G11C 19/28* (2006.01)

(52) U.S. Cl.
CPC ......... *G06F 3/0412* (2013.01); *G09G 3/2092* (2013.01); *G09G 3/3225* (2013.01); *G09G 3/3266* (2013.01); *G09G 3/3674* (2013.01); *G09G 3/3677* (2013.01); *G06F 2203/04103* (2013.01); *G09G 2300/0413* (2013.01); *G09G 2300/0809* (2013.01); *G09G 2310/0243* (2013.01); *G09G 2310/0286* (2013.01); *G11C 19/28* (2013.01); *G11C 19/287* (2013.01)

(58) Field of Classification Search
CPC ........ G09G 2310/0286; G09G 3/3677; G09G 3/3233; G09G 3/3674; G09G 3/3266; G09G 3/3648; G09G 2300/0413; G09G 2300/0809; G09G 2310/0243; G09G 3/20; G09G 3/2092; G11C 19/287; G11C 19/28

See application file for complete search history.

(56) References Cited

U.S. PATENT DOCUMENTS

| | | | |
|---|---|---|---|
| 11,450,253 B2 * | 9/2022 | He | G09G 3/20 |
| 2011/0102389 A1 * | 5/2011 | Park | G06F 3/0412 |
| | | | 345/205 |

(Continued)

*Primary Examiner* — Dismery Mercedes
(74) *Attorney, Agent, or Firm* — Fenwick & West LLP

(57) ABSTRACT

A touch display device, a display panel, and a gate driving circuit are disclosed. A touch display device comprises a display panel having subpixels, a gate driving circuit including gate stages for applying a scan signal to the display panel through gate lines and dummy stages selectively disposed between the gate stages, and a touch driving circuit applying a touch driving signal to the display panel through touch lines and receiving a touch sensing signal generated by the display panel, wherein the dummy stages are divided into two or more dummy stage groups, and wherein a group control signal line for applying a group control signal based on dummy stage group and an individual control signal line for applying an individual control signal to each dummy stage included in the dummy stage group are disposed along a bezel area.

20 Claims, 20 Drawing Sheets

(56) References Cited

U.S. PATENT DOCUMENTS

| | | | |
|---|---|---|---|
| 2012/0162170 A1* | 6/2012 | Ochiai | G11C 19/287 345/208 |
| 2014/0354523 A1* | 12/2014 | So | G09G 3/3677 345/100 |
| 2015/0015474 A1* | 1/2015 | Miyake | G11C 19/28 345/100 |
| 2016/0224175 A1* | 8/2016 | Moon | G06F 3/0412 |
| 2017/0047018 A1* | 2/2017 | Park | G09G 3/3266 |
| 2017/0052635 A1* | 2/2017 | Yu | G06F 3/0446 |
| 2017/0221411 A1* | 8/2017 | Chang | G11C 19/287 |
| 2018/0096645 A1* | 4/2018 | Lee | G09G 3/20 |
| 2018/0197481 A1* | 7/2018 | Choi | G09G 3/3266 |
| 2019/0073074 A1* | 3/2019 | Kim | G06F 3/0412 |
| 2019/0147824 A1* | 5/2019 | Lee | G11C 19/287 345/55 |
| 2020/0251066 A1* | 8/2020 | Hu | G09G 3/3677 |
| 2021/0304660 A1* | 9/2021 | Maruyama | G09G 3/3266 |
| 2022/0068211 A1* | 3/2022 | Jeong | H10K 59/123 |
| 2022/0415250 A1* | 12/2022 | Choi | G09G 3/3208 |

\* cited by examiner

TOUCH DISPLAY DEVICE, DISPLAY PANEL, AND GATE DRIVING CIRCUIT

CROSS-REFERENCE TO RELATED APPLICATION

This application claims priority from Republic of Korea Patent Application No. 10-2022-0059168, filed on May 13, 2022, which is hereby incorporated by reference in its entirety.

BACKGROUND

Field

Embodiments of the disclosure relate to a touch display device, a display panel, and a gate driving circuit that simplify the layout of signal lines and reduce a bezel area of the touch display device.

Description of Related Art

With the development of multimedia, the importance of flat panel display devices is increasing. In response, flat panel display devices, such as liquid crystal displays, plasma display panels, and organic light emitting displays, have been commercialized.

Also in wide use are touch display devices having a touch panel stacked on a display device, which may detect the point touched by the user's hand or a stylus pen when an electrical characteristic, such as resistance or capacitance, is changed at the touch point, output information corresponding to the touch point, or perform calculation.

Such a touch display device is a user interface and has increasing application to, e.g., small portable terminals, office devices, mobile devices, and the like.

However, as the touch display device has a separate touch panel stacked on the display panel, it has many drawbacks, such as an increased thickness, reduced light transmittance, and increased manufacturing costs. To address such issues, advanced in-cell touch (AIT)-type touch display devices are proposed which have built-in touch electrodes inside the pixel areas of the display panel.

Such a touch display device may operate in separate driving modes including a vertical blank (VB) driving mode in which a touch driving operation is performed in one vertical blank period within one display frame period and a long horizontal blank (LHB) driving mode in which a touch driving operation is performed in a plurality of touch driving periods (long horizontal blank (LHB)) in one display frame period.

Since in the VB driving mode, the display driving period mainly occurs within one display frame period, the VB driving mode is mainly used in high-resolution touch display devices. Since in the LHB driving mode, a plurality of touch driving periods are included in one display frame period, the LHB driving mode is mainly used in touch display devices having high touch sensitivity.

In the touch display device operating in the LHB driving mode, a plurality of dummy stage circuits in the positions corresponding to the touch driving period may be positioned in the gate driving circuit to hold the scan signal applied to the display panel during the touch driving period when the touch driving operation is performed.

In this case, the number of dummy stage circuits increases as the number of touch driving periods included within one display frame period increases, which complicates the layout of the touch display device and increases the bezel area due to the signal lines to control the operation of the dummy stage circuits.

SUMMARY

A touch display device, a display panel, and a gate driving circuit capable are disclosed that simplify the layout of signal lines and reduce the bezel area of the touch display device.

Embodiments of the disclosure may provide a touch display device, a display panel, and a gate driving circuit, that simplify the layout of signal lines and reduce the bezel area by connecting dummy start signal lines and dummy off signal lines on a basis of group, for the plurality of dummy stage circuits disposed in the gate driving circuit.

Embodiments of the disclosure may provide a touch display device, a display panel, and a gate driving circuit, that simplify the layout of signal lines and reduce the bezel area by configuring the dummy stage circuit whose operation is controlled by the dummy start signal applied through the dummy start signal line and the dummy off signal applied through the dummy off signal line.

Embodiments of the disclosure may provide a touch display device, a display panel, and a gate driving circuit, that simplify the layout of signal lines and reduce the bezel area by connecting dummy start signal lines and dummy select signal lines on a basis of group, for the plurality of dummy stage circuits disposed in the gate driving circuit.

Embodiments of the disclosure may provide a touch display device, a display panel, and a gate driving circuit, that simplify the layout of signal lines and reduce the bezel area by configuring the dummy stage circuit whose operation is controlled by the dummy start signal applied through the dummy start signal line and the dummy select signal applied through the dummy select signal line.

Embodiments of the disclosure may provide a touch display device comprising a display panel having a plurality of subpixels, a gate driving circuit including a plurality of gate stages for applying a scan signal to the display panel through a plurality of gate lines and a plurality of dummy stages selectively disposed between the plurality of gate stages, a touch driving circuit applying a touch driving signal to the display panel through a plurality of touch lines and receiving a touch sensing signal generated by the display panel, and a timing controller controlling the gate driving circuit and the touch driving circuit, wherein the plurality of dummy stages are divided into two or more dummy stage groups, and wherein a group control signal line for applying a group control signal on a basis of dummy stage group and an individual control signal line for applying an individual control signal to each dummy stage included in the dummy stage group are disposed along a bezel area.

Embodiments of the disclosure may provide a display panel comprising a plurality of subpixels and a gate driving circuit positioned in a bezel area and including a plurality of gate stages for applying a scan signal to a plurality of subpixels through a plurality of gate lines and a plurality of dummy stages selectively disposed between the plurality of gate stages, wherein a group control signal line for applying a group control signal on a basis of dummy stage group and an individual control signal line for applying an individual control signal to each dummy stage included in the dummy stage group are disposed along the bezel area.

Embodiments of the disclosure may provide a gate driving circuit comprising a plurality of gate stages for applying a scan signal to a display panel through a plurality of gate lines and a plurality of dummy stages selectively disposed between the plurality of gate stages, wherein the plurality of dummy stages include a charge transistor charging a Q node by a dummy start signal, a discharge transistor discharging the Q node by a dummy off signal, a pull-up transistor connected to the Q node, a pull-down transistor connected to a QB node, a reset transistor discharging the Q node by a reset signal, and a switch circuit controlling a voltage level of the QB node.

Embodiments of the disclosure may provide a gate driving circuit comprising a plurality of gate stages for applying a scan signal to a display panel through a plurality of gate lines and a plurality of dummy stages selectively disposed between the plurality of gate stages, wherein the plurality of dummy stages include a charge transistor charging a Q node by a dummy start signal and a dummy select signal, a pull-up transistor connected to the Q node, a pull-down transistor connected to a QB node, a reset transistor discharging the Q node by a reset signal, and a switch circuit controlling a voltage level of the QB node.

According to embodiments of the disclosure, there may be provided a touch display device, a display panel, and a gate driving circuit that simplify the layout of signal lines and reduce the bezel area.

According to embodiments of the disclosure, there may be provided a touch display device, a display panel, and a gate driving circuit, that simplify the layout of signal lines and reduce the bezel area by connecting dummy start signal lines and dummy off signal lines on a basis of group, for the plurality of dummy stage circuits disposed in the gate driving circuit.

According to embodiments of the disclosure, there may be provided a touch display device, a display panel, and a gate driving circuit, that simplify the layout of signal lines and reduce the bezel area by configuring the dummy stage circuit whose operation is controlled by the dummy start signal applied through the dummy start signal line and the dummy off signal applied through the dummy off signal line.

According to embodiments of the disclosure, there may be provided a touch display device, a display panel, and a gate driving circuit, that simplify the layout of signal lines and reduce the bezel area by connecting dummy start signal lines and dummy select signal lines on a basis of group, for the plurality of dummy stage circuits disposed in the gate driving circuit.

According to embodiments of the disclosure, there may be provided a touch display device, a display panel, and a gate driving circuit, that simplify the layout of signal lines and reduce the bezel area by configuring the dummy stage circuit whose operation is controlled by the dummy start signal applied through the dummy start signal line and the dummy select signal applied through the dummy select signal line.

BRIEF DESCRIPTION OF DRAWINGS

The above and other objects, features, and advantages of the disclosure will be more clearly understood from the following detailed description, taken in conjunction with the accompanying drawings, in which.

DETAILED DESCRIPTION

Figure 1:
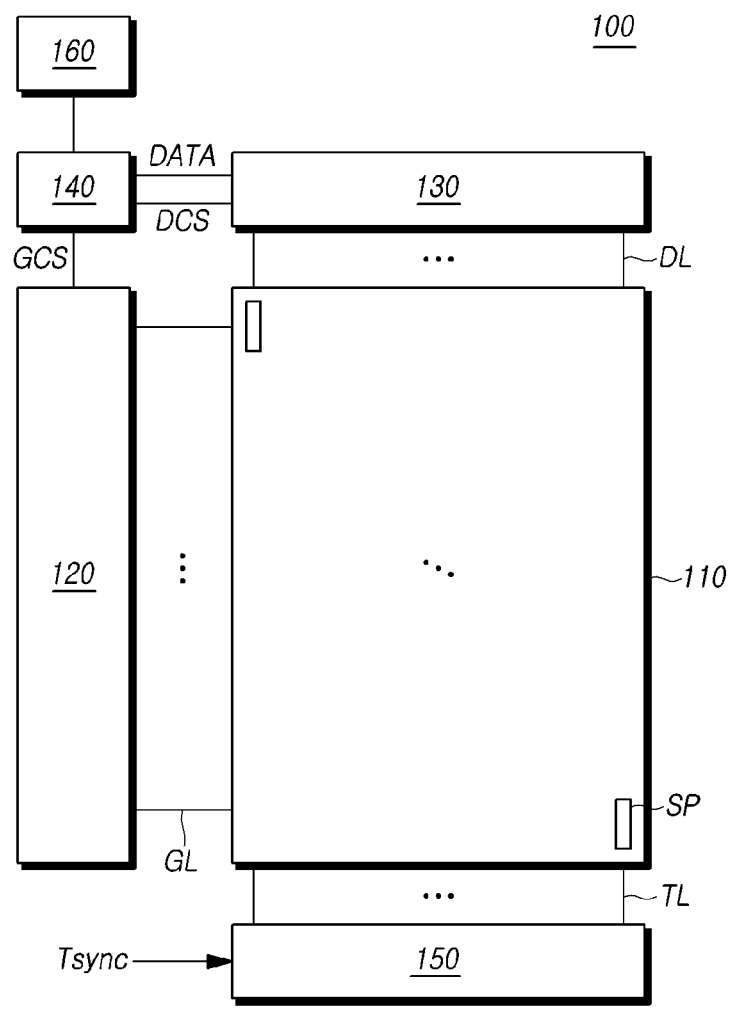
FIG. 1 is a view schematically illustrating a configuration of a touch display device according to embodiments of the disclosure.

Hereinafter, some embodiments of the disclosure will be described in detail with reference to exemplary drawings. In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the disclosure will be described in detail with reference to the accompanying drawings.

FIG. 1 is a view schematically illustrating a configuration of a touch display device according to embodiments of the disclosure.

Referring to FIG. 1, a touch display device 100 according to embodiments of the disclosure may include a display panel 110, a gate driving circuit 120, a data driving circuit 130, a timing controller 140, and the display panel 110 and may include a touch driving circuit 150 and a power management circuit (power management integrated circuit (IC)) 160 for sensing a touch.

The display panel 110 may include a plurality of gate lines GL, a plurality of data lines DL, and a plurality of subpixels SP disposed at the crossings of the gate lines GL and the data lines DL.

Multiple touch electrodes may be arranged or embedded in the display panel 110, and multiple touch lines TL for electrically connecting the touch electrodes with the touch driving circuit 150 may be arranged on the display panel 110.

The configuration for display driving in the display device 100 is described first. The gate driving circuit 120 controls the driving timing of the subpixels SP disposed on the display panel 110. The data driving circuit 130 applies a data voltage corresponding to image data to the subpixel SP. As a result, the subpixel SP emits light with a brightness corresponding to the gray level of the image data to display the image.

Specifically, the gate driving circuit 120 may be controlled by the timing controller 140 to sequentially output scan signals to the plurality of gate lines GL disposed in the display panel 110, controlling the driving timing of the subpixels SP.

The gate driving circuit 120 may include one or more gate driving integrated circuits GDIC. Depending on driving schemes, the gate driving circuit 120 may be positioned on only one side, or each of two opposite sides, of the display panel 110. The gate driving circuit 120 may be implemented in a gate-in-panel (GIP) form which is directly embedded in the bezel area of the display panel 110.

The data driving circuit 130 receives digital image data DATA from the timing controller 140 and converts the image data DATA into an analog data voltage. The data driving circuit 130 outputs a data voltage to each data line DL according to the timing of applying a scan signal via the gate line GL, allowing each subpixel SP to represent a brightness according to the data voltage.

The data driving circuit 130 may include one or more source driving integrated circuits SDIC.

The timing controller 140 applies various control signals to the gate driving circuit 120 and the data driving circuit 130 and controls the operation of the gate driving circuit 120 and the data driving circuit 130.

The timing controller 140 enables the gate driving circuit 120 to output scan signals according to the timing of implementing each frame, converts image data received from the outside to meet the data signal format used by the data driving circuit 130, and outputs the resultant image data DATA to the data driving circuit 130.

The timing controller 140 receives, from outside (e.g., a host system) the display device 100, various timing signals including a vertical synchronization signal, a horizontal synchronization signal, an input data enable signal, and a clock signal, along with the image data DATA.

The timing controller 140 may generate a data control signal DCS and a gate control signal GCS according to various timing signals received from the outside and may output them to the data driving circuit 130 and the gate driving circuit 120, respectively.

As an example, to control the gate driving circuit 120, the timing controller 140 outputs various gate control signals GCS including a gate start pulse, a gate shift clock, and a gate output enable signal.

The gate start pulse controls the operation start timing of one or more gate driving integrated circuits constituting the gate driving circuit 120. The gate shift clock is a clock signal commonly input to one or more gate driving integrated circuits and controls the shift timing of the scan signals. The gate output enable signal designates timing information about one or more gate driving integrated circuits.

To control the data driving circuit 130, the timing controller 140 outputs various data control signals DCS including, e.g., a source start pulse, a source sampling clock, and a source output enable signal.

The source start pulse controls the data sampling start timing of one or more source driving integrated circuits constituting the data driving circuit 130. The source sampling clock is a clock signal for controlling the sampling timing of data in each source driving integrated circuit. The source output enable signal controls the output timing of the data driving circuit 130.

The touch display device 100 may include a touch driving circuit 150 that performs touch sensing and stylus sensing according to the signal received through the display panel 110 by driving the display panel 110 having a built-in touchscreen panel.

The touch driving circuit 150 may include a first circuit for applying the touch driving signal to the touch electrode constituting the display panel 110 and receiving the touch sensing signal through the touch line TL from the touch electrode and a second circuit for detecting whether there are passive touch sensing (finger touch sensing) and active touch sensing using the sensing signal received through the display panel 110.

The first circuit may be referred to as a touch sensing circuit (read out integrated circuit (ROIC)), and the second circuit may be referred to as a touch controller.

The touch driving circuit 150 may sense the presence and/or position of a touch based on a deviation in capacitance between the touch electrodes formed on the display panel 110. In other words, a deviation in capacitance occurs between a position contacted by a passive stylus including the user's finger or an active stylus and a non-contact position. The touch driving circuit 150 senses the presence and position of a touch in such a manner as to detect the capacitance deviation.

The timing controller 140 controls the touch driving circuit 150. The touch driving circuit 150 may receive the touch synchronization signal Tsync from the timing controller 140 and generate a touch driving signal based on the touch synchronization signal Tsync. The touch driving circuit 150 transmits and receives a touch sensing signal and a touch driving signal based on an interface defined between it and the display panel 110.

The touch display device 100 may further include a power management circuit 160 that applies various voltages or currents to, e.g., the display panel 110, the gate driving circuit 120, the data driving circuit 150, and the touch driving circuit 150 or controls various voltages or currents to be applied.

The power management circuit 160 adjusts the direct current (DC) input voltage applied from the host system, generating power required to drive the display panel 110, the gate driving circuit 120, the data driving circuit 130, and the touch driving circuit 150.

The data driving circuit 130 applying the data voltage to the data line DL is also referred to as a source driving circuit or a source driving integrated circuit SDIC, and the touch driving circuit 150 and the data driving circuit 130 may be together implemented as an integrated driving circuit SRIC.

In this case, the integrated driving circuit SRIC may be of a chip on film (COF) type mounted on a film and may be embedded in the display panel 110 or mounted on a printed circuit board (PCB).

The film on which the integrated driving circuit SRIC is mounted may be coupled to each of the bonding unit of the display panel 110 and the bonding unit of the printed circuit board (PCB).

A touch controller may be mounted on the printed circuit board (PCB).

The touch driving circuit 150 and the data driving circuit 130 may be integrated in separate driving chips. The touch driving circuit 150 may be electrically connected to a plurality of touch electrodes constituting the display panel 110 through a plurality of sensing lines.

In this case, the touch driving circuit 150 may perform touch sensing in a time-divided touch driving period separately from the display driving period. The touch driving period for performing touch sensing may proceed simultaneously with the display driving period.

When an encapsulation layer is formed on the display panel 110, and the touch electrode is disposed thereon, the capacitance for driving the touch electrode may increase. Thus, it is necessary to increase the level of the touch driving signal for driving the touch electrode. To that end, a level shifter (not shown) may be added between the touch driving circuit 150 and the display panel 110 to control the level of the touch driving signal.

Each subpixel SP may be defined by the crossing of a gate line GL and a data line DL, and liquid crystals or a light emitting element may be disposed in each subpixel SP depending on the type of the touch display device 100.

As an example, when the display device 100 is a liquid crystal display device, the display device 100 may include a light source device, such as a backlight unit, to emit light to the display panel 110. Liquid crystals are disposed in the subpixel SP of the display panel 110. The alignment of liquid crystals may be adjusted by an electric field created as data voltage is applied to each subpixel SP, thereby representing a brightness according to the data voltage and displaying an image.

In the case of a liquid crystal display device, the display panel 110 may include a liquid crystal layer formed between two substrates and may be operated in any known mode, such as a twisted nematic (TN) mode, a vertical alignment (VA) mode, an in-plane switching (IPS) mode, or a fringe field switching (FFS) mode.

In the case of an organic light emitting display device, the display panel 110 may be implemented in a top emission scheme, a bottom emission scheme, or a dual-emission scheme.

Meanwhile, the display device 100 according to embodiments of the disclosure may detect the user's touch on the display panel 110 using the touch driving circuit 150 and the touch electrodes included in the display panel 110.

Figure 2:
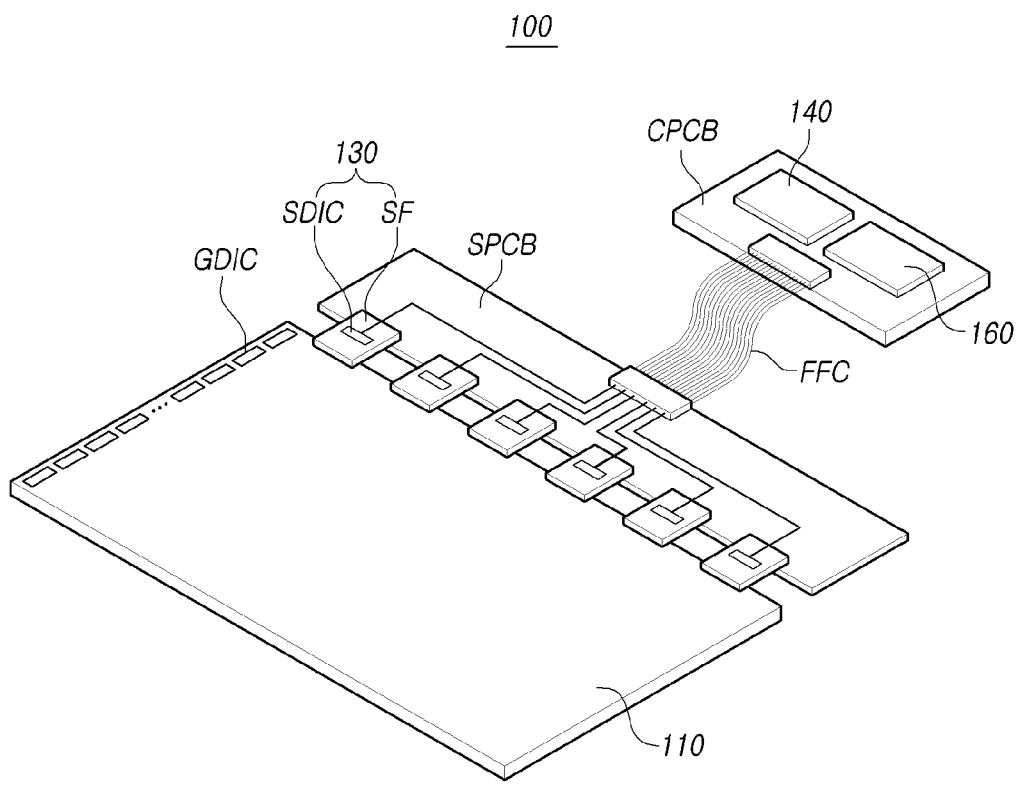
FIG. 2 is a view illustrating an example of a system of a touch display device according to embodiments of the disclosure.

FIG. 2 is a view illustrating an example of a system of a touch display device according to embodiments of the disclosure.

Referring to FIG. 2, in the touch display device 100 according to embodiments of the disclosure, the source driving integrated circuit SDIC included in the data driving circuit 130 is implemented in a chip-on-film (COF) type among various types (e.g., TAB, COG, or COF), and the gate driving circuit 120 is implemented in a gate-in-panel (GIP) type among various types (e.g., TAB, COG, COF, or GIP).

When the gate driving circuit 120 is implemented in the GIP type, the plurality of gate driving integrated circuits GDIC included in the gate driving circuit 120 may be directly formed in the bezel area of the display panel 110. In this case, the gate driving integrated circuits GDIC may receive various signals (e.g., a clock signal, a gate high signal, a gate low signal, etc.) necessary for generating scan signals through gate driving-related signal lines disposed in the bezel area.

Likewise, one or more source driving integrated circuits SDIC included in the data driving circuit 130 each may be mounted on the source film SF, and one side of the source film SF may be electrically connected with the display panel 110. Lines for electrically connecting the source driver integrated circuit SDIC and the display panel 110 may be disposed on the source film SF.

The touch display device 100 may include at least one source printed circuit board SPCB for circuit connection between a plurality of source driving integrated circuits SDIC and other devices and a control printed circuit board CPCB for mounting control components and various electric devices.

The other side of the source film SF where the source driving integrated circuit SDIC is mounted may be connected to at least one source printed circuit board SPCB. In other words, one side of the source film SF where the source driving integrated circuit SDIC is mounted may be electrically connected with the display panel 110, and the other side thereof may be electrically connected with the source printed circuit board SPCB.

The timing controller 140 and the power management circuit (power management IC) 160 may be mounted on the control printed circuit board CPCB. The timing controller 140 may control the operation of the data driving circuit 130 and the gate driving circuit 120. The power management circuit 160 may apply driving voltage or current to the display panel 110, the data driving circuit 130, and the gate driving circuit 120 and control the applied voltage or current.

At least one source printed circuit board SPCB and control printed circuit board CPCB may be circuit-connected through at least one connection member. The connection member may include, e.g., a flexible printed circuit FPC or a flexible flat cable FFC. The at least one source printed circuit board SPCB and control printed circuit board CPCB may be integrated into a single printed circuit board.

The power management circuit 160 transfers a driving voltage necessary for display driving or characteristic value sensing to the source printed circuit board SPCB through the flexible printed circuit FPC or flexible flat cable FFC. The driving voltage transferred to the source printed circuit board SPCB is applied to emit light or sense a specific subpixel SP in the display panel 110 through the source driving integrated circuit SDIC.

Each of the subpixels SP arranged in the touch display panel 110 in the display device 100 may include a light emitting element and a circuit element, e.g., a driving transistor, for driving a light emitting element such as the organic light emitting diode.

The type and number of circuit elements constituting each subpixel SP may be varied depending on functions to be provided and design schemes.

Figure 3:
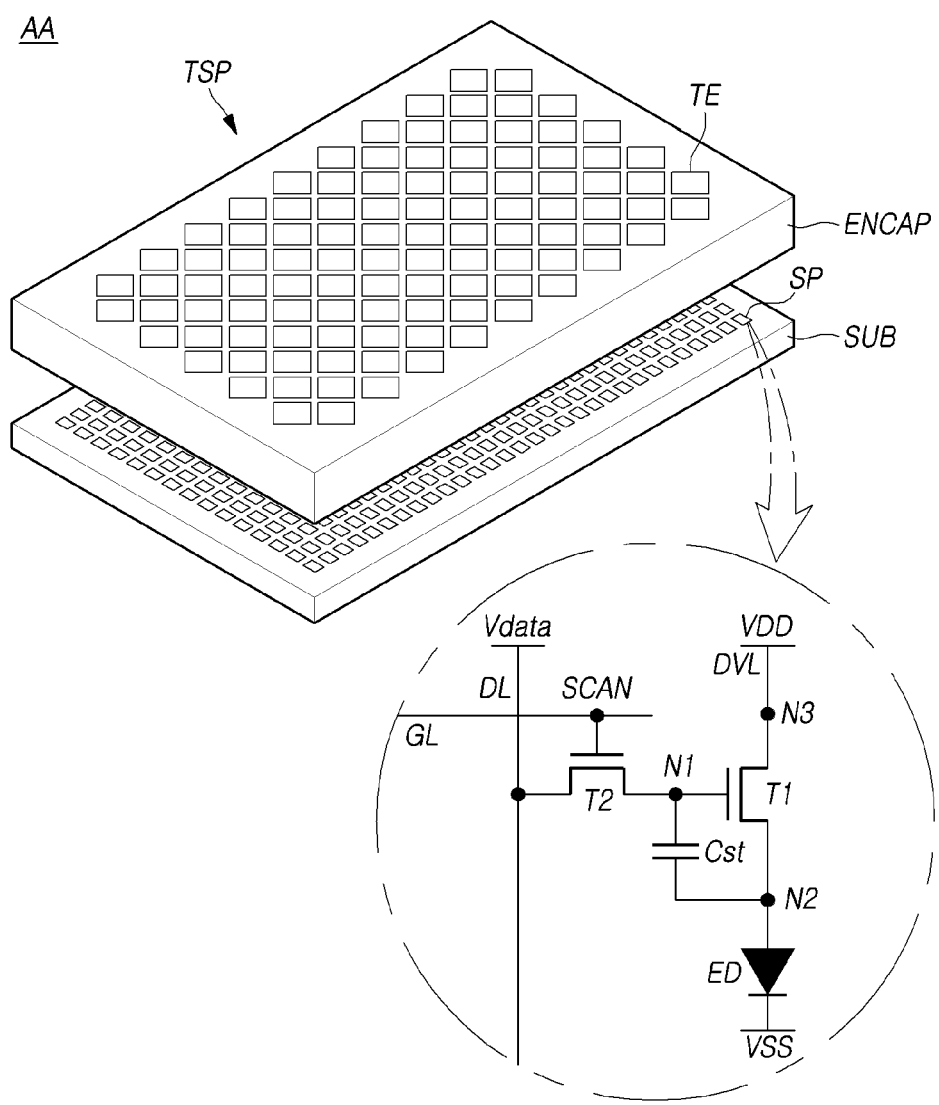
FIG. 3 is a view illustrating an example of a structure in which a touchscreen panel is embedded in a display panel in a touch display device according to embodiments of the disclosure.

FIG. 3 is a view illustrating an example of a structure in which a touchscreen panel is embedded in a display panel in a touch display device according to embodiments of the disclosure.

Referring to FIG. 3, in the touch display device 100 according to embodiments of the disclosure, a plurality of subpixels SP are arranged on the substrate SUB in the display area AA of the display panel 110.

Each subpixel SP may include a light emitting element ED, a first transistor T1 for driving the light emitting element ED, a second transistor T2 for transferring a data voltage Vdata to a first node N1 of the first transistor T1, and a storage capacitor Cst for maintaining a constant voltage during one frame.

The first transistor T1 may include the first node N1 to which the data voltage Vdata may be applied through the second transistor T2, a second node N2 electrically connected with the light emitting element ED, and a third node N3 to which a driving voltage VDD is applied from a driving voltage line DVL. The first node N1 may be a gate node, the second node N2 may be a source node or a drain node, and the third node N3 may be the drain node or the source node. The first transistor T1 is referred to as a driving transistor for driving the light emitting element ED.

The light emitting element ED may include a first electrode (e.g., an anode electrode), a light emitting layer, and a second electrode (e.g., a cathode electrode). The first electrode may be electrically connected with the second node N2 of the first transistor T1, and a base voltage VSS may be applied to the second electrode.

The light emitting layer in the light emitting element ED may be an organic light emitting layer containing an organic material. In this case, the light emitting element ED may be an organic light emitting diode.

The second transistor T2 may be on/off controlled by a scan signal SCAN applied via the gate line GL and be electrically connected between the first node N1 of the first transistor T1 and the data line DL. The second transistor T2 may be referred to as a switching transistor.

If the second transistor T2 is turned on by the scan signal SCAN, the data voltage Vdata applied through the data line DL is transferred to the first node N1 of the first transistor T1.

The storage capacitor Cst may be electrically connected between the first node N1 and second node N2 of the first transistor T1.

Each subpixel SP may have a 2T1C structure which includes two transistors T1 and T2 and one capacitor Cst and, in some cases, each subpixel SP may further include one or more transistors or one or more capacitors.

The storage capacitor Cst may be not the parasitic capacitor which may be present between the first node N1 and second node N2 of the first transistor T1, but an external capacitor intentionally designed outside the first transistor T1.

Each of the first transistor T1 and the second transistor T2 may be an n-type transistor or a p-type transistor.

Circuit elements, such as the light emitting element ED, two or more transistors T1 and T2, and one or more capacitors Cst, are disposed on the display panel 110. Since the circuit elements are vulnerable to external moisture or oxygen, an encapsulation layer ENCAP for preventing or at least reducing external moisture or oxygen from penetrating into the circuit elements may be disposed on the display panel 110.

In the touch display device 100 according to embodiments of the disclosure, the touchscreen panel TSP may be formed on the encapsulation layer ENCAP and embedded in the display panel 110. In other words, in the touch display device 100, the plurality of touch electrodes TE constituting the touchscreen panel TSP may be disposed on the encapsulation layer ENCAP to configure the display panel 110.

As a capacitance-based touch sensing scheme, the touch display device 100 may sense a touch using a mutual capacitance scheme or a self-capacitance scheme.

In the case of a mutual capacitance-based touch sensing scheme, the plurality of touch electrodes TE may be divided into touch driving electrodes to which touch driving signals are applied through touch driving lines and touch sensing electrodes where touch sensing signals are sensed through the touch sensing lines and which, together with the touch driving electrodes, form capacitance. In this case, the touch driving line and the touch sensing line may be collectively referred to as a touch line, and the touch driving signal and the touch sensing signal may be collectively referred to as a touch signal.

In the case of such a mutual capacitance-based touch sensing scheme, the presence or absence of a touch and touch coordinates are detected based on a change in the mutual capacitance caused between the touch driving electrode and the touch sensing electrode according to the presence or absence of a pointer, such as a finger or a pen.

In the self-capacitance-based touch sensing scheme, each touch electrode TE plays a role both as a touch driving electrode and as a touch sensing electrode. In other words, the touch driving signal is applied to the touch electrode TE through one touch line, and the touch sensing signal transferred from the touch electrode TE to which the touch driving signal is applied is received through the same touch line. Accordingly, in the self-capacitance-based touch sensing scheme, there is no distinction between the touch driving electrode and the touch sensing electrode and no distinction between the touch driving line and the touch sensing line.

In the case of such a self-capacitance-based touch sensing scheme, the presence or absence of a touch and touch coordinates are detected based on a change in capacitance caused between a pointer, such as a finger or a pen, and the touch electrode TE.

As such, the touch display device 100 may sense a touch in the mutual capacitance-based touch sensing scheme or self-capacitance based touch sensing scheme.

In this case, the display panel 110 may be of a split type in which each of the plurality of touch electrodes TE is separated from another, or a woven type in which touch electrodes TE of different sizes are disposed in adjacent rows (or columns).

Figure 4:
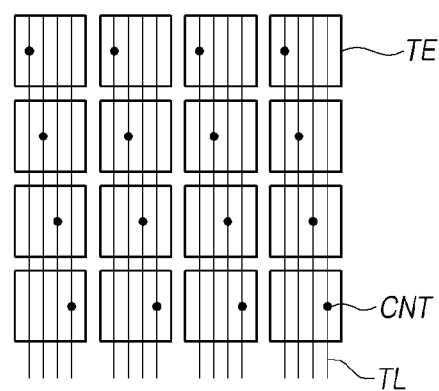
FIG. 4 is a view illustrating a display panel in which split-type touch electrodes are arranged in a touch display device according to embodiments of the disclosure.

FIG. 4 is a view illustrating a display panel in which split-type touch electrodes are arranged in a touch display device according to embodiments of the disclosure.

Referring to FIG. 4, in the case of the display panel 110 having split-type touch electrodes TE of the same shape in the touch display device 100 according to embodiments of the disclosure, each of the plurality of touch electrodes TE may be electrically connected with a corresponding touch line TL where the touch driving signal or touch sensing signal is transferred through one or more contact holes CNT.

The plurality of touch electrodes TE may be positioned in the display area of the display panel 110. In some cases, some (e.g., the outermost touch electrodes) of the plurality of touch electrodes TE may be positioned in an area (outer area) outside the display area or extend up to the area (outer area) outside the display area. The display area may be an area where an image is displayed or an area where touch sensing is possible.

In this case, the plurality of touch lines TL electrically connected to the plurality of touch electrodes TE may be positioned in the display area. In some cases, all or some the touch lines TL may be positioned outside the display area. When the plurality of touch lines TL electrically connected to the plurality of touch electrodes TE are positioned in the display area, the plurality of touch lines TL may be positioned on a different layer from the plurality of touch electrodes TE and overlap the plurality of touch electrodes TE.

All of the plurality of touch lines TL may have the same or similar lengths and be disposed from points connected to the touch driving circuit 150 to the opposite points. Each of the plurality of touch lines TL may differ only in the position electrically connected to the corresponding touch electrode TE (i.e., the position of the contact hole CNT).

In the case of the split-type display panel 110, if one touch electrode TE is electrically connected to one touch line TL, as many touch lines TL as the number of touch electrodes TE will be required. The number of touch lines TL corresponds to the number of touch channels for signal input/output of the touch driving circuit 150.

Accordingly, in the case of a split type including 4×4 touch electrodes TE, 16 touch lines TL respectively connected to the 16 touch electrodes TE are disposed, so that at least 16 touch channels are required.

The touch display device 100 of the disclosure may be formed in a woven type in which touch electrodes TE of different sizes are disposed in adjacent rows or columns, rather than a split type in which each of the plurality of touch electrodes TE is separated from another.

Figure 5:
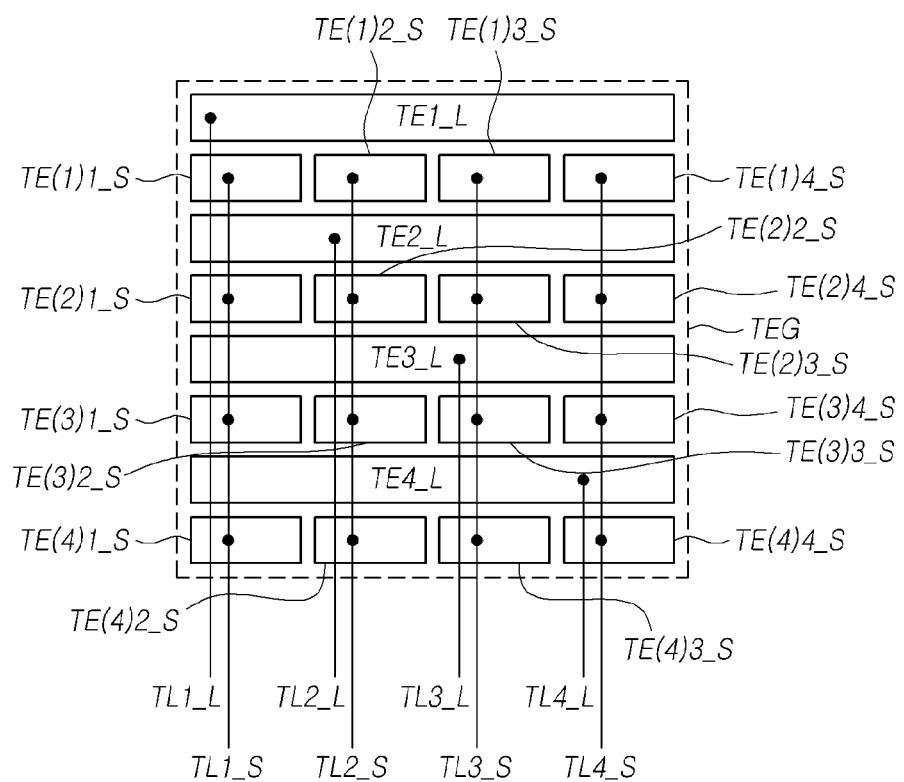
FIG. 5 is a view illustrating an example of a display panel in which woven-type touch electrodes are arranged in a touch display device according to embodiments of the disclosure.

FIG. 5 is a view illustrating an example of a display panel in which woven-type touch electrodes are arranged in a touch display device according to embodiments of the disclosure.

Referring to FIG. 5, in the touch display device 100 according to embodiments of the disclosure, the woven-type display panel 110 may include touch electrode groups TEG each including four long touch electrodes TE1_L to TE4_L and four short touch electrodes TE1_S to TE4_S connected in the same line.

In other words, the long touch electrodes TE1_L, TE2_L, TE3_L, and TE4_L elongated in the row direction may correspond to the length of the four short touch electrodes TE(1)1_S, TE(1)2_S, TE(1)3_S, and TE(1)4_S and, in this case, the four short touch electrodes (e.g., TE(1)1_S, TE(2)1_S, TE(3)1_S, and TE(4)1_S) in the column direction may be connected to one short touch line (e.g., TL1_S). Accordingly, four short touch electrodes disposed in the column direction may be connected by one same line to constitute one short touch electrode block, and four long touch electrodes and four short touch electrode blocks corresponding thereto and connected by the same line may form one touch electrode group TEG.

In the case of a woven-type 4×4 touch electrode structure, the number of touch electrodes in the row in which long touch electrodes are disposed among two adjacent rows corresponds to ¼ of the number of touch electrodes in the row in which the short touch electrode is disposed. Accordingly, the lengths of the long touch electrode TE1_L, TE2_L, TE3_L, and TE4_L are about four times the length of the short touch electrode TE1_S to TE4_S.

In this case, the woven-type 4×4 touch electrode structure includes four long touch electrodes TE1_L, TE2_L, TE3_L, and TE4_L and 16 short touch electrodes TE(1)1_S, TE(1)2_S, TE(1)3_S, and TE(1)4_S to TE(4)1_S, TE(4)2_S, TE(4)3_S, and TE(4)4_S), but the four short touch electrodes in the column direction (e.g., TE(1)1_S, TE(2)1_S, TE(3)1_S, and TE(4)1_S) are connected to one short touch line (e.g., TL1_S).

Therefore, as four short touch electrodes (e.g., TE(1)1_S, TE(2)1_S, TE(3)1_S, and TE(4)1_S) connected to the short touch line (e.g., TL1_S) form one short touch electrode block connected by the same line, 16 short touch electrodes TE(1)1_S, TE(1)2_S, TE(1)3_S, and TE(1)4_S to TE(4)1_S, TE(4)2_S, TE(4)3_S, and TE(4)4_S constitute four short touch electrode blocks connected by the same line.

As a result, four long touch line TL1_L, TL2_L, TL3_L, and TL4_L are connected to the four long touch electrodes TE1_L, TE2_L, TE3_L, and TE4_L, respectively, and the short touch lines TL1_S, TL2_S, TL3_S, and TL4_S are connected one by one to the four short touch electrode blocks each connected by the same line. Thus, in the case of the woven-type 4×4 touch electrode structure, eight touch lines TL1_L, TL2_L, TL3_L, TL4L, TL1_S, TL2_S, TL3_S, and TL4_S and 8 touch channels are required.

Therefore, as compared with the split-type touch electrode structure, the woven-type touch electrode structure may reduce the number of touch lines and the number of touch channels.

Although the size of the touch electrode group TEG may be varied, the size of the touch electrode group TEG may be determined considering the distance from a finger or a stylus for multi-touch detection to efficiently arrange the touch electrodes TE on the display panel 110 and increase the accuracy of multi-touch detection.

A plurality of woven-type touch electrode groups TEG may be disposed on the display panel 110 in a horizontal direction and a vertical direction in which case each touch electrode group TEG may be electrically separated in the display area where an image is displayed but may be connected to the touch driving circuit 150 through the touch line TL in the non-display area where no image is displayed.

Figure 6:
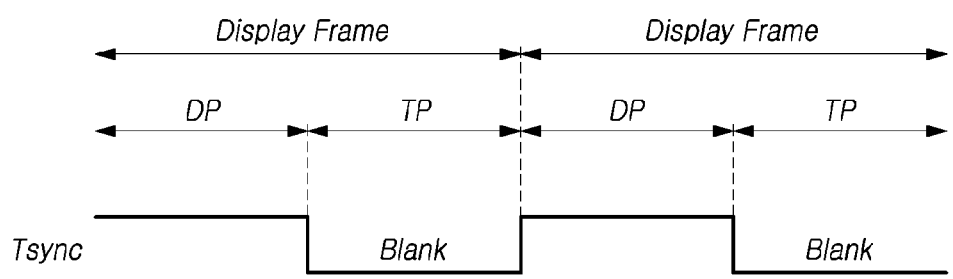
FIG. 6 is a timing diagram illustrating a display driving period and a touch driving period in a touch display device according to embodiments of the disclosure.

FIG. 6 is a timing diagram illustrating a display driving period and a touch driving period in a touch display device according to embodiments of the disclosure.

Referring to FIG. 6, the touch display device 100 according to embodiments of the disclosure may perform display driving for image display during a predetermined display driving period DP within one display frame period Display Frame and may perform touch driving for sensing a touch input by a finger or a stylus during a predetermined touch driving period TP.

The touch display device 100 uses a common electrode for driving each pixel as an electrode for touch detection. Accordingly, a common voltage is applied to the thin film transistor connected to the common electrode during the display driving period DP, and a touch driving signal is applied to the common electrode, which operates as a touch electrode, during the touch driving period TP.

The display driving period DP and the touch driving period TP may be temporally identical or overlap each other or be temporally separated periods.

When the display driving period DP and the touch driving period TP are temporally separated may be referred to as time division driving.

When the display driving period DP and the touch driving period TP are temporally identical, display driving and touch driving may be performed simultaneously, and such driving scheme may be referred to as time free driving.

In the case of time division driving, the display driving period DP and the touch driving period TP may alternate.

As such, when the display driving period DP and the touch driving period TP are temporally separated while alternating, the touch driving period TP may correspond to a blank period when display driving is not performed.

The touch display device 100 may generate a touch synchronization signal Tsync swinging to a high level and a low level, thereby identifying or controlling the display driving period DP and the touch driving period TP. In other words, the touch synchronization signal Tsync may be a timing control signal defining the touch driving period TP.

For example, a high-level period (or a low-level period) of the touch synchronization signal Tsync may correspond to the display driving period DP, and the low-level period (or high-level period) of the touch synchronization signal Tsync may correspond to the touch driving period TP.

In this case, the touch driving circuit 150 may apply the touch driving signal to the touch electrode TE during the touch driving period TP in which the touch synchronization signal Tsync is at the low level and may sense the presence or absence of a touch and the touch position of the passive stylus or the active stylus using the touch sensing signal received from the touch electrode TE.

In relation to the scheme of allocating the display driving period DP and the touch driving period TP within one display frame period Display Frame, one display frame period Display Frame may be divided into one display driving period DP and one touch driving period TP, and display driving may be performed during one display driving period DP and touch driving for sensing the touch input by the passive stylus and the active stylus may be performed during one touch driving period TP which corresponds to a vertical blank period Vertical Blank.

In other words, the touch display device 100 may perform driving for a touch once during the display frame period Display Frame which is one period of the frame frequency or the screen change period (refresh rate) of the display panel 110.

For example, when the frame frequency is 60 Hz, display driving of turning on or off the pixels through N gate lines GL constituting the display panel 110 within a period of ¹⁄₆₀ seconds (16.7 ms) is performed, and then, the touch driving period TP for touch sensing proceeds for a predetermined interval. In this case, the touch detection frequency (touch report rate) will be 60 Hz.

As such, touch driving where display driving is performed during one display driving period DP in one display frame period Display Frame, and touch driving is performed during one touch driving period TP which corresponds to the vertical blank period Vertical Blank may be referred to as "VB driving." In the VB driving mode, the display driving period DP may correspond to 80% of ¹⁄₆₀ second (16.7 ms), and the touch driving period TP may correspond to 20% of ¹⁄₆₀ second (16.7 ms).

As another example, one display frame period Display Frame may be divided into two or more display driving periods DP and two or more touch driving periods TP. Display driving may be performed during two or more display driving periods DP within one display frame period Display Frame, and touch driving for sensing one or two or more touch inputs by the passive stylus and the active stylus in the whole or part of the screen may be performed during two or more touch driving periods TP.

As such, when one display frame period Display Frame is divided into two or more display driving periods DP and two or more touch driving periods TP, and display driving and touch driving are performed, each of two or more blank periods Blank corresponding to two or more touch driving periods TP within one display frame period Display Frame is referred to as a long horizontal blank (LHB).

Accordingly, two or more periods when touch sensing of a stylus or a finger is performed within the display frame period Display Frame may be referred to as an LHB or touch driving period TP, and touch driving performed during two or more LHBs within one display frame period Display Frame may be referred to as "LHB driving." In the LHB driving mode, the display driving period DP and the touch driving period TP each may correspond to 50% of ¹⁄₆₀ second (16.7 ms).

Figure 7:
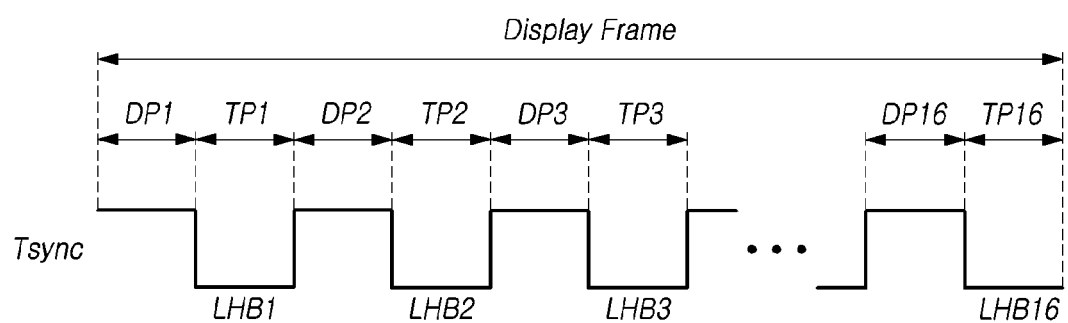
FIG. 7 is an example LHB driving timing diagram in a touch display device according to embodiments of the disclosure.

FIG. 7 is an example LHB driving timing diagram in a touch display device according to embodiments of the disclosure.

Referring to FIG. 7, in the touch display device 100 according to embodiments of the disclosure, one display frame period Display Frame may be time-divided into 16 display driving periods DP1 to DP16 and 16 touch driving periods TP1-TP16.

In this case, the 16 touch driving periods TP1-TP16 may correspond to 16 LHB periods LHB1 to LHB16.

In this case, the touch display device 100 may divide one display frame period Display Frame into one or more display driving periods DP1 to DP16 and one or more touch driving periods TP1-TP16 to alternately perform display driving and touch driving.

Alternatively, the touch driving period TP1-TP16 may proceed independently of the display driving period DP1 to DP16.

In the VB driving mode, the display driving period DP has a high proportion of 80% of one display frame period Display Frame. Thus, the VB driving mode may be adopted mainly in touch display devices 100 having relatively low sensitivity and high resolution. In contrast, the LHB driving mode includes a plurality of touch driving periods TP in one display frame period Display Frame and may thus be adopted in touch display devices 100 having high touch sensitivity.

Figure 8:
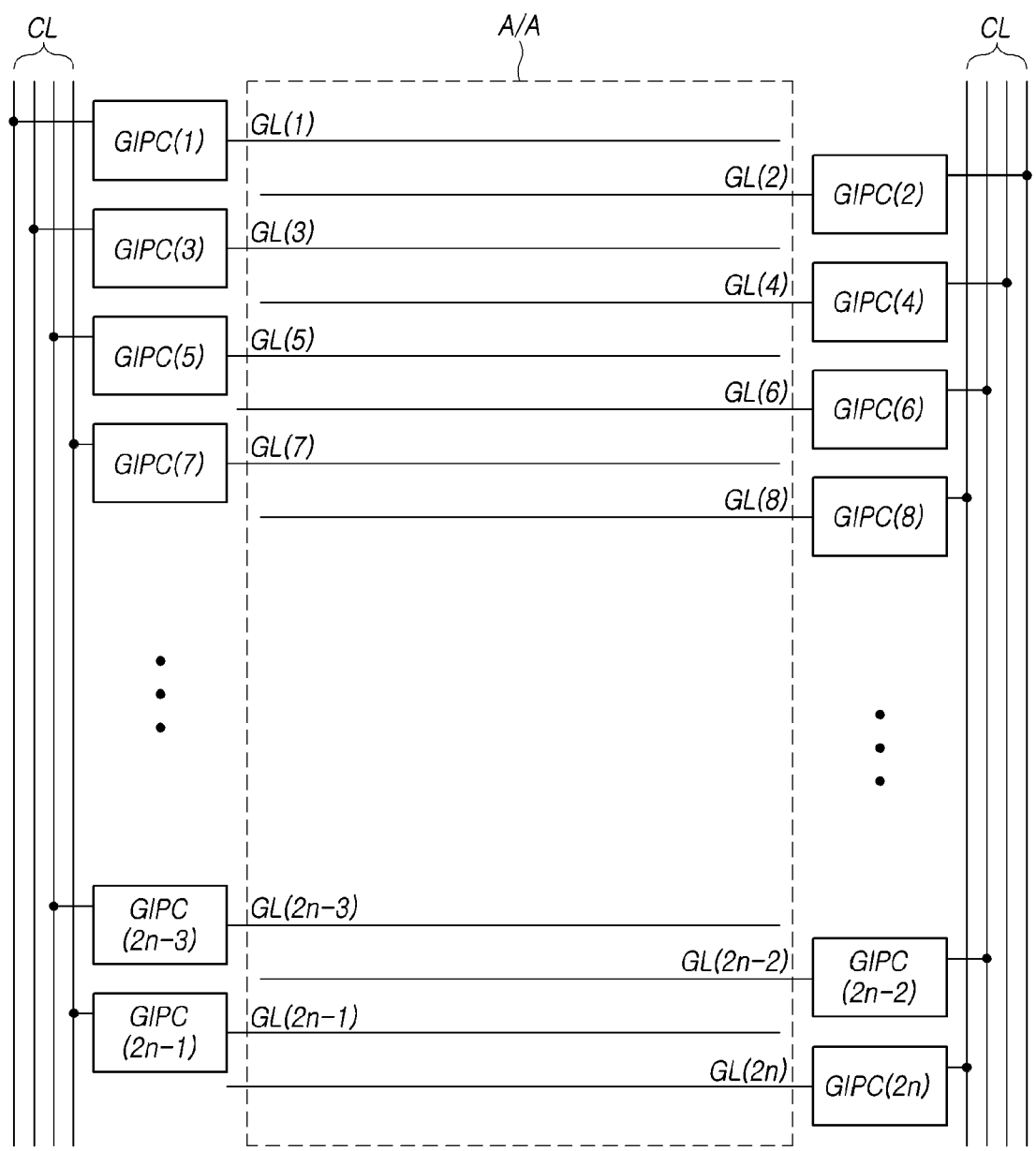
FIG. 8 is a view illustrating an example of a display panel in which a gate driving circuit is implemented in a GIP type in a touch display device according to embodiments of the disclosure.

FIG. 8 is a view illustrating an example of a display panel in which a gate driving circuit is implemented in a GIP type in a touch display device according to embodiments of the disclosure.

Referring to FIG. 8, in the touch display device 100 according to embodiments of the disclosure, 2n gate lines GL(1) to GL(2n) (where n is a natural number) may be disposed in the display area A/A for displaying an image in the display panel 110.

In this case, the gate driving circuit 120 may include 2n GIP circuits (GIP Circuit) GIPC corresponding to 2n gate lines GL(1) to GL(2n) and embedded and disposed in the non-display area corresponding to the outer portion of the display area A/A of the display panel 110. The GIP circuit GIPC may correspond to the gate driving integrated circuit GDIC.

Accordingly, the 2n GIP circuits GIPC may output the scan signal SCAN to the 2n gate lines GL(1) to GL(2n).

As such, when the gate driving circuit 120 is implemented in a GIP type, it is not necessary to form a separate integrated circuit having a gate driving function and bond it to the display panel 110. Thus, it is possible to reduce the number of integrated circuits and omit the process of connecting the integrated circuits to the display panel 110. It is also possible to reduce the size of the bezel area for bonding the integrated circuit in the display panel 110.

The 2n GIP circuits GIPC may be denoted as GIPC(1), GIPC(2), . . . GIPC(2n) to be distinguished from each other and to identify a correspondence relationship between the 2n gate lines GL(1) to GL(2n).

Shown here is an example in which the 2n GIP circuits GIPC(1) to GIPC(2n) are disposed on two divided sides of the display area A/A. For example, among the 2n GIP circuits GIPC(1) to GIPC(2n), the odd-numbered GIP circuits GIPC(1), GIPC(3), . . . , GIPC(2n-1) may drive the odd-numbered gate line GL(1), GL(3), . . . , GL(2n-1). Among the 2n GIP circuits GIPC(1) to GIPC(2n), the even-numbered GIP circuits GIPC(2), GIPC(4), . . . , GIPC(2n) may drive the even-numbered gate lines GL(2), GL (4), . . . , GL(2n).

Alternatively, the 2n GIP circuits GIPC(1) to GIPC(2n) may be disposed on one side of the display area A/A.

A plurality of clock signal lines CL for transferring gate clocks necessary for generating and outputting the scan signal SCAN to the gate driving circuit 120 may be disposed in the non-display area corresponding to the outer portion of the display area A/A of the display panel 110.

Figure 9:
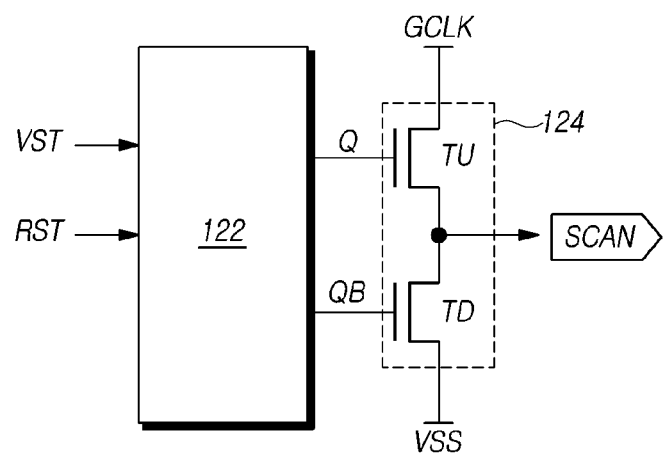
FIG. 9 is a block diagram schematically illustrating a configuration of a GIP circuit in a display device according to embodiments of the disclosure.

FIG. 9 is a block diagram schematically illustrating a configuration of a GIP circuit in a display device according to embodiments of the disclosure.

Referring to FIG. 9, in the display device 100 according to embodiments of the disclosure, one GIP circuit GIPC may include a shift register 122 (e.g., a circuit) and a buffer circuit 124.

The GIP circuit GIPC starts to operate according to the gate start pulse VST and outputs the scan signal SCAN according to the gate clock GCLK. The scan signal SCAN output from the GIP circuit GIPC is sequentially shifted and sequentially applied through the gate line GL.

The buffer circuit 124 has two nodes Q and QB that are important to the gate driving state and may include a pull-up transistor TU and a pull-down transistor TD. The gate node of the pull-up transistor TU may correspond to the Q node, and the gate node of the pull-down transistor TD may correspond to the QB node.

The shift register 122 may also be referred to as a shift logic circuit and may be used to generate the scan signal SCAN in synchronization with the gate clock GCLK.

The shift register 122 may control the Q node and the QB node connected to the buffer circuit 124 so that the buffer circuit 124 may output the scan signal SCAN and, to this end, may include a plurality of transistors.

The shift register 122 charges the Q node in response to a gate start pulse VST input through the VST terminal or a carry signal received from the previous stage and discharges the Q node in response to a reset signal received through the RST terminal. A reset signal for simultaneously discharging the Q nodes of all stages may be applied to the RST terminal.

The shift register 122 starts to generate the scan signal SCAN, and the output of the shift register 122 is sequentially turned on according to the gate clock GCLK. In other words, it is possible to transfer the logic state for sequentially determining on/off of the gate line GL by controlling the output time of the shift register 122 using the gate clock GCLK.

According to the shift register 122, the respective voltage states of the Q node and the QB node of the buffer circuit 124 may be different. Accordingly, the buffer circuit 124 may output a voltage for turning on the corresponding gate line GL (e.g., which corresponds to a high-level voltage or low-level voltage and may be, e.g., a clock signal having the high gate level voltage VGH) to the corresponding gate line GL or a voltage for turning on the corresponding gate line GL (e.g., which corresponds to a low-level voltage or high-level voltage and may be, e.g., a base voltage VSS having the gate low-level voltage VGL) to the corresponding gate line GL.

Meanwhile, one GIP circuit GIPC may further include a level shifter in addition to the shift register 122 and the buffer circuit 124.

In this case, the shift register 122 and the buffer circuit 124 constituting the GIP circuit GIPC may be connected in various structures.

As such, in the touch display device 100 operating in the LHB driving mode, a scan signal is applied to the display panel 110 in the display driving period DP to display an image but, in the touch driving period TP, no scan signal is applied to the display panel 110.

Therefore, in the touch display device 100, the display panel 110 may be divided into a plurality of panel blocks to correspond to the display driving period DP, and the gate driving integrated circuit GDIC may be disposed in a position corresponding to each panel block.

Further, as a dummy stage circuit is disposed in a position corresponding to the touch driving period TP positioned between display driving periods DP, the scan signal generated by the gate driving circuit during the touch driving period TP may be put on hold.

Figure 10:
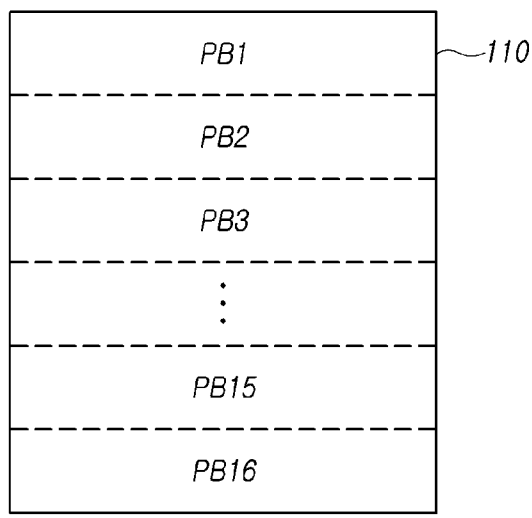
FIG. 10 is a view illustrating an example of a configuration of a display panel for LHB driving in a touch display device according to embodiments of the disclosure.

FIG. 10 is a view illustrating an example of a configuration of a display panel for LHB driving in a touch display device according to embodiments of the disclosure.

Referring to FIG. 10, in the touch display device 100 according to an embodiment of the disclosure, the display panel 110 may be divided into a plurality of panel blocks PB1-PB16 that are separately driven with the touch driving period TP left therebetween.

The panel blocks PB1-PB16 may mean pixel areas that are separately driven in each unit corresponding to the display driving period DP, rather than ones into which the display panel 110 is physically divided.

In this case, the number of panel blocks may vary. Shown here is an example of 16 LHB driving where one display frame period Display Frame is divided into 16 display driving periods DP1 to DP16 and 16 touch driving periods TP1-TP16.

The panel blocks PB1-PB16 may be time-divisionally driven with the touch driving period TP left therebetween. For example, during a first display driving period D1, the subpixels SP disposed on the first panel block PB1 are driven to apply the data voltage Vdata of the current frame to the corresponding subpixel SP and, during the subsequent first touch driving period T1, the touch input may be sensed for the whole or partial area of the display panel 110.

Subsequently, during the second display driving period D2, the subpixels SP disposed on the second panel block PB2 may be driven and, during the second touch driving period T2, the touch input may be sensed for the whole or partial area of the display panel 110.

In this order, the data voltage Vdata may be applied to 16 panel blocks PB1-PB16 during 16 display driving periods DP1 to DP16 within one display frame period Display Frame, and the touch input to the display panel 110 may be sensed during the 16 touch driving periods TP1-TP16.

Figure 11:
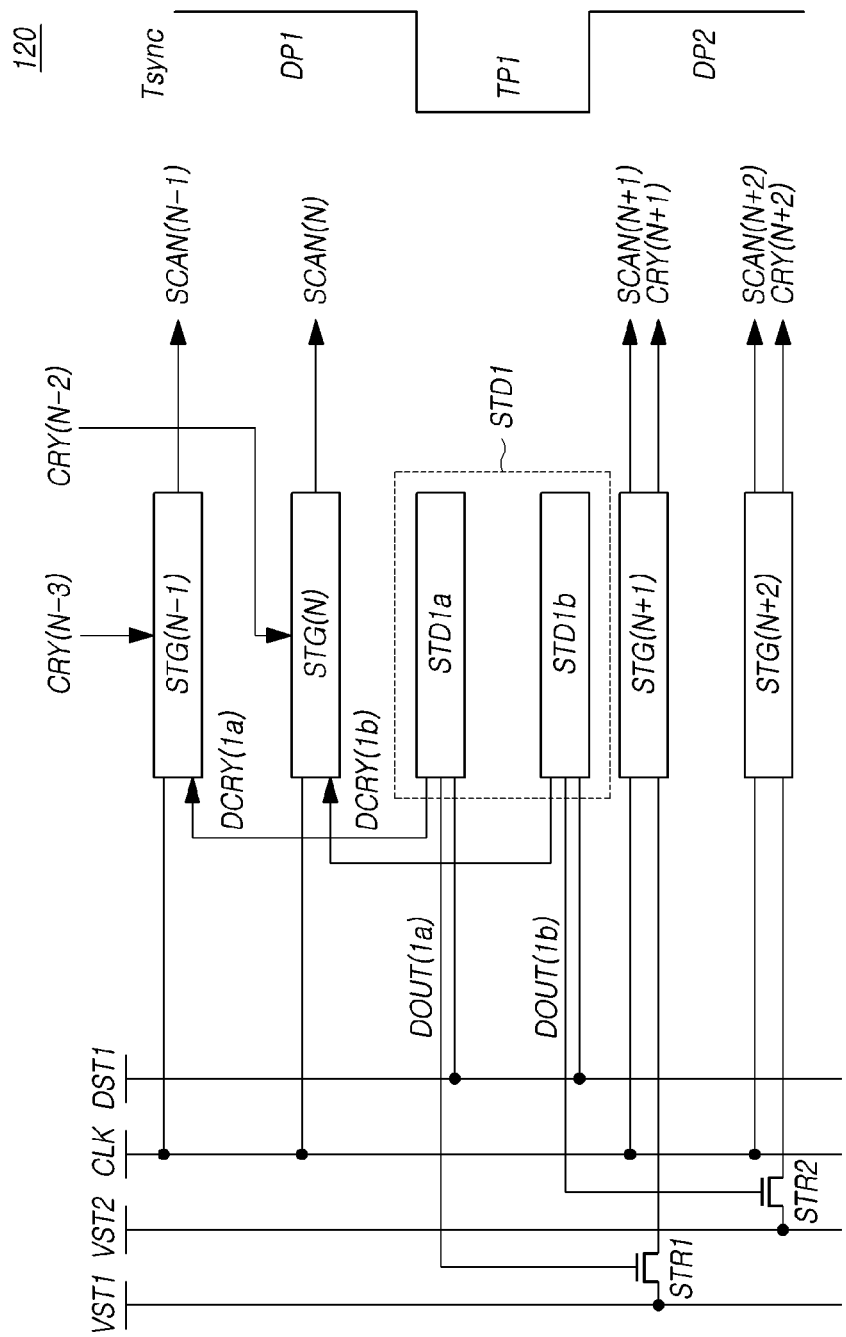
FIG. 11 is a view illustrating an example of a gate driving circuit corresponding to a boundary portion of a panel block in a touch display device according to embodiments of the disclosure.

FIG. 11 is a view illustrating an example of a gate driving circuit corresponding to a boundary portion of a panel block in a touch display device according to embodiments of the disclosure.

Referring to FIG. 11, in the touch display device 100 according to embodiments of the disclosure, the gate driving circuit 120 may include a dummy stage STD1 selectively disposed between a plurality of dependently connected gate stages STG(N−1), STG(N), STG(N+1), and STG(N+2) and a plurality of gate stages STG(N−1), STG(N), STG(N+1), and STG(N+2). When the gate driving circuit 120 is configured in a GIP type, each gate stage STG may correspond to a GIP circuit GIPC.

For example, when the display panel 110 includes 1,920× 2,880 pixels, and the display panel 110 may be divided into 16 panel blocks PB1-PB16, each panel block PB may include 120 gate stages STG (N=120) capable of outputting a scan signal SCAN through 120 gate lines GL during a display driving period DP, and a dummy stage STD for holding the scan signal SCAN during a touch driving period TP may be disposed between the panel blocks PB.

Here, the Nth gate stage STG(N) and the N+1th gate stage STG(N+1) are assumed to be gate stages that output scan signals SCAN(N and SCAN(N+1) at the boundaries between neighboring panel blocks PB1 and PB2.

The Nth scan signal SCAN(N) and the N+1th scan signal SCAN(N+1) may be gate pulse voltages applied to the Nth gate line GL(N) and the N+1th gate line GL(N+1).

The gate stages STG(N) and STG(N+1) may generate carry signals CRY(N) and CRY(N+1) that are output simultaneously with the scan signals SCAN(N) and SCAN(N+1) and are applied to different gate stages.

In this case, the carry signal may be applied to the gate stage or dummy stage of the next stage or be applied to the second next stage while skipping the next stage. Here, a case where the carry signal is applied, in an interlaced manner, to the second next stage. When the carry signal is applied in an interlaced manner, the dummy stage STD1 may include a first dummy stage STD1a at the front end and a first dummy stage STD1b at the rear end.

For example, the carry signal CRY(N−2) of the N−2th gate stage STG(N−2) may be provided as an input of the Nth gate stage STG(N), and the carry signal CRY(N+1) of the N+1th gate stage STG(N+1) may be provided as an input of the N+3th gate stage STG(N+3). The manner in which the carry signal is applied may vary.

The Nth gate stage STG(N) generates the last scan signal, that is, the Nth scan signal SCAN(N), in the first display driving period DP1. The N+1th gate stage STG(N+1) generates the first scan signal, i.e., the N+1th scan signal SCAN(N+1), in the second display drive period DP2 after the first touch drive period TP1.

The gate line GL(N) connected to the Nth gate stage STG(N) and the gate line GL(N+1) connected to the N+1th gate stage STG(N+1) may neighbor each other in the boundary area between the first panel block PB1 and the second panel block PB2.

The first dummy stage STD1 is a circuit disposed between the Nth gate stage STG(N) that outputs the last scan signal SCAN(N) in the first panel block PB1 and the N+1th gate stage STG(N+1) that outputs the first scan signal SCAN(N+1) in the second panel block PB2.

When the carry signal is transferred in an interlaced manner, each dummy stage circuit STD may include a dummy stage circuit at the front end and a dummy stage circuit at the rear end.

Accordingly, only one dummy stage STD may be disposed between two panel blocks, or two or more dummy stages may be disposed.

The first dummy stage STD1a at the front end and the first dummy stage STD1b at the rear end may be provided with a dummy start signal DST1 that is applied when the first touch driving period TP1 ends and the second display driving period DP2 starts, generating dummy output signals DOUT(1a) and DOUT(1b).

The dummy output signals DOUT(1a) and DOUT(1b) may turn on the start transistors STR1 and STR2, respectively, so that the gate start signals VST1 and VST2 are provided to the N+1th gate stage STG(N+1) and the N+2th gate stage STG(N+2). Alternatively, without the start transistors STR1 and STR2, the dummy output signals DOUT(1a) and DOUT(1b) may act as gate start signals of the N+1st gate stage STG(N+1) and the N+2th gate stage STG(N+2).

The first dummy stage STD1a at the front end and the first dummy stage STD1b at the back end may generate dummy carry signals DCRY(1a) and DCRY(1b) simultaneously with the dummy output signals DOUT(1a) and DOUT(1b). The dummy carry signals DCRY(1a) and DCRY(1b) may be provided as reset signals of the preceding gate stages STG (N−1) and STG(N), respectively.

Here, the plurality of gate stages STG may be disposed to correspond to the display driving period DP. The dummy stage STD may be selectively disposed between the plurality of gate stages STG to correspond to the touch driving period TP.

Figure 12:
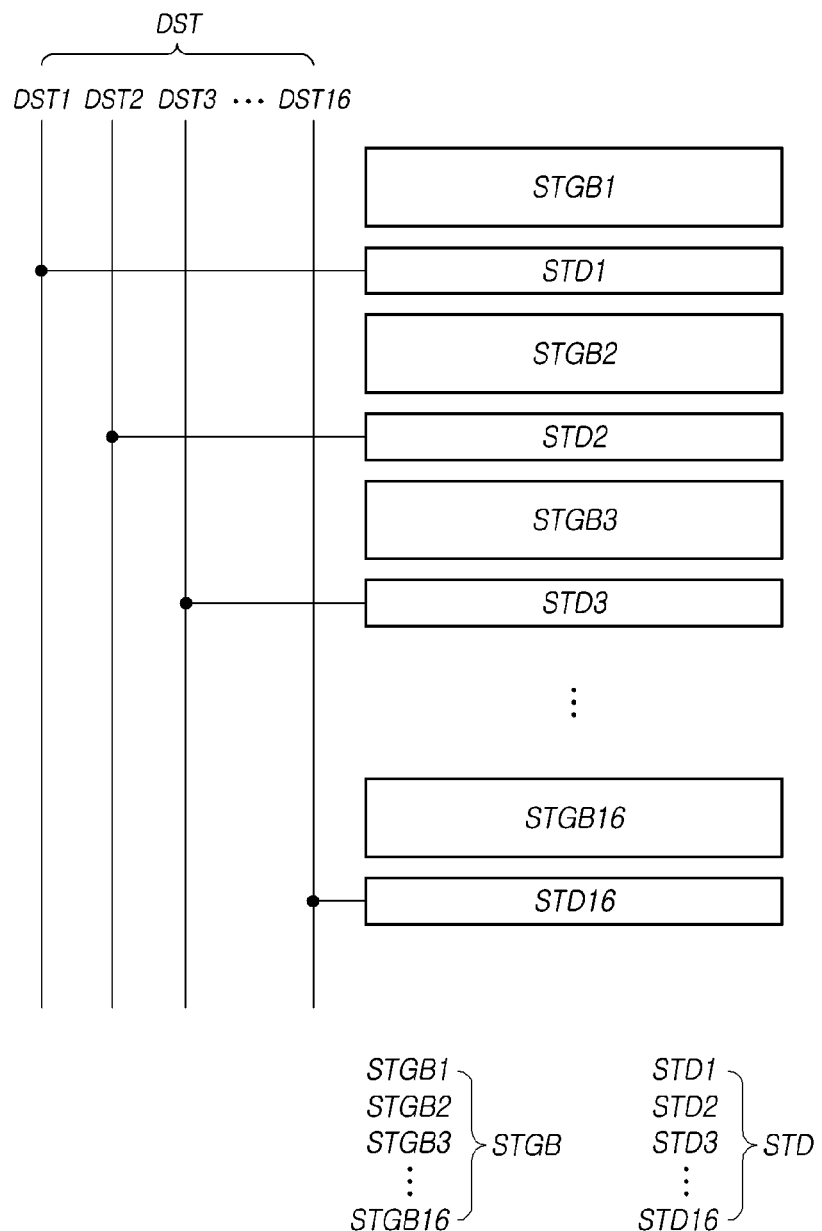
FIGS. 12 and 13 are views illustrating an example of a layout of signal lines for applying dummy start signals to dummy stages in a touch display device according to embodiments of the disclosure.
Figure 13:
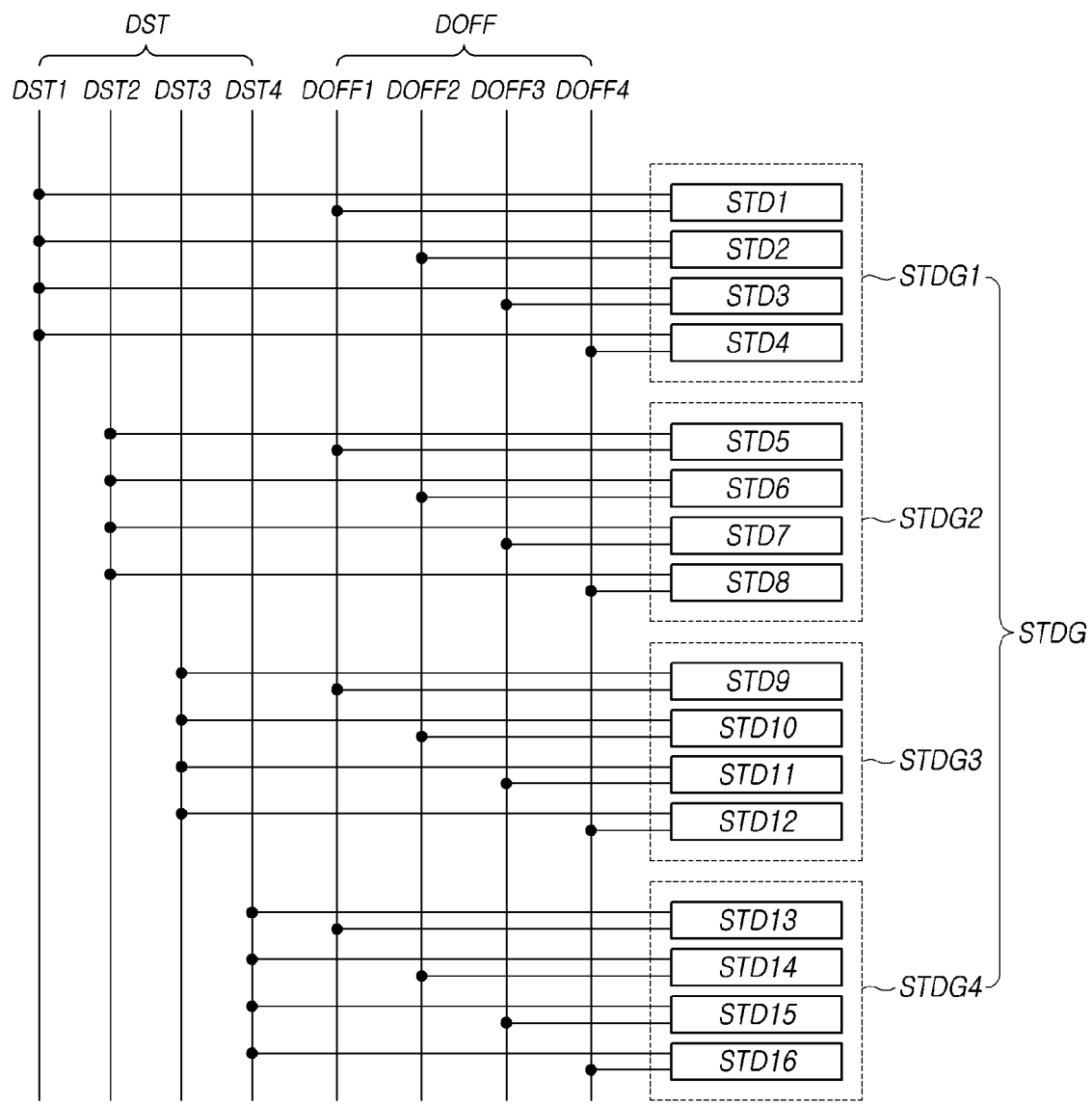

FIGS. 12 and 13 are views illustrating an example of a layout of signal lines for applying dummy start signals to dummy stages in a touch display device according to embodiments of the disclosure.

Referring to FIG. 12, the gate driving circuit 120 of the touch display device 100 according to embodiments of the disclosure may include a plurality of gate stage blocks STGB1 to STGB16 and a plurality of dummy stages STD1 to STD16 selectively disposed between the plurality of gate stage blocks STGB1 to STGB16.

Here, each gate stage block STGB may include a plurality of gate stages STG. One gate stage block STGB may be disposed in a position corresponding to one panel block PB.

For example, if the display panel 110 is divided into 16 panel blocks PB1-PB16 corresponding to 16 display driving periods DP1 to DP16, 16 gate stage blocks STGB1 to STGB16 may be disposed in positions corresponding to the 16 panel blocks PB1-PB16, and 16 dummy stages STD1 to STD16 may selectively be disposed between the gate stage blocks STGB.

In this case, each dummy stage STD may have a dummy start signal line that applies a dummy start signal DST.

For example, if there are 16 display driving periods DP1 to DP16 and 16 touch driving periods TP1-TP16 within one display frame period, 16 panel blocks PB1-PB16 and 16 dummy stages STD1 to STD16 are disposed, so that 16 dummy start signal lines are required to apply 16 dummy start signals DST1-DST16.

In this case, the dummy start signal line may extend along the bezel area of the display panel 110. Accordingly, as the number of dummy start signal lines for applying the dummy start signals DST1-DST16 increases, the width of the bezel area inevitably increases.

Therefore, in the touch display device 100 of the disclosure, it is possible to simplify the layout of the bezel area and reduce the number of dummy start signal lines by using both the dummy start signal DST and the dummy off signal DFF.

Referring to FIG. 13, in the touch display device 100 according to embodiments of the disclosure, the plurality of dummy stages STD1 to STD16 constituting the gate driving circuit 120 are divided into groups, and the dummy start signal DST is applied on a basis of group simultaneously with sequentially controlling the dummy stages STD1 to STD16 using the dummy off signal DOFF.

For example, 16 dummy stages STD1 to STD16 may be divided into 4 dummy stage groups STDG1 to STDG4), and 4 dummy stages STD may be disposed in each dummy stage group STDG1 to STDG4.

In other words, the first dummy stage STD1 to the fourth dummy stage STD4 are disposed in the first dummy stage group STDG1, and the fifth dummy stage STD5 to eighth dummy stage STD8 are disposed in the second dummy stage group STDG2. Further, the ninth dummy stage STD9 to 12th dummy stage STD12 are disposed in the third dummy stage group STDG3, and the 13th dummy stage STD13 to 16th dummy stage STD16 are disposed in the fourth dummy stage group STDG4.

In this state, the first dummy start signal line for applying the first dummy start signal DST1 is connected to all of the first dummy stage STD1 to the fourth dummy stage STD4 included in the first dummy stage group STDG1. Accordingly, the first dummy stage STD1 to the fourth dummy stage STD4 included in the first dummy stage group STDG1 may be simultaneously driven by the first dummy start signal DST1.

Further, the second dummy start signal line for applying the second dummy start signal DST2 is connected to all of the fifth dummy stage STD5 to the eighth dummy stage STD8 included in the second dummy stage group STDG2. Accordingly, the fifth dummy stage STD5 to the eighth dummy stage STD8 included in the second dummy stage group STDG2 may be simultaneously driven by the second dummy start signal DST2.

Further, the third dummy start signal line for applying the third dummy start signal DST3 is connected to all of the ninth dummy stage STD9 to twelfth dummy stage STD12 included in the third dummy stage group STDG3. Accordingly, the ninth dummy stage STD9 to twelfth dummy stage STD12 included in the third dummy stage group STDG3 may be simultaneously driven by the third dummy start signal DST3.

Further, the fourth dummy start signal line for applying the fourth dummy start signal DST4 is connected to all of the thirteenth dummy stage STD13 to the sixteenth dummy stage STD16 included in the fourth dummy stage group STDG4. Accordingly, the thirteenth dummy stage STD13 to the sixteenth dummy stage STD16 included in the fourth dummy stage group STDG4 may be simultaneously driven by the fourth dummy start signal DST4.

Meanwhile, the first dummy off signal line for transferring the first dummy off signal DOFF1 is simultaneously connected to the respective first dummy stages STD1, STD5, STD9 and STD13 of the dummy stage groups STDG1 to STDG4, and the second dummy off signal line for transferring the second dummy off signal DOFF2 is simultaneously connected to the respective second dummy stages STD2, STD6, STD10 and STD14 of the dummy stage groups STDG1 to STDG4.

Further, the third dummy off signal line for transferring the third dummy off signal DOFF3 is simultaneously connected to the respective third dummy stages STD3, STD7, STD11, and STD15 of the dummy stage groups STDG1 to STDG4, and the fourth dummy off signal line for transferring the fourth dummy off signal DOFF4 is simultaneously connected to the respective fourth dummy stages STD4, STD8, STD12, and STD16 of the dummy stage groups STDG1 to STDG4.

For example, when the first dummy start signal DST1 is applied at a high level, the first dummy stage STD1 to the fourth dummy stage STD4 included in the first dummy stage group STDG1 may be all driven. However, by applying the second to fourth dummy off signals DOFF2 to DOFF4 at a high level, the dummy output signal DOUT and the dummy carry signal DCRY may be prevented from being output from the second dummy stage STD2 to the fourth dummy stage STD4. In other words, only the first dummy stage STD1 may be driven by using the first dummy start signal DST1 and the second to fourth dummy off signals DOFF2 to DOFF4.

Similarly, the second dummy stage STD2 may be turned on by a high-level first dummy start signal DST1 and high-level first dummy off signal DOFF1, third dummy off signal DOFF3, and fourth dummy off signal DOFF4.

In other words, the operation of each dummy stage STD1 to STD16 may be individually controlled by using four dummy start signals DST1 to DST4 and four dummy off signals DOFF1 to DOFF4.

As a result, only 4 dummy start signal lines and 4 dummy off signal lines are required to control the gate driving circuit 120 in which 16 dummy stages STD1 to STD16 are disposed, so that it is possible to simplify the layout of the bezel area and reduce the width of the bezel area.

Meanwhile, when the dummy stage group STDG is composed of 4 dummy stages STD, 4 dummy start signal lines and 4 dummy off signal lines are required to control 16 dummy stages STD1 to STD16. However, if the number of dummy stages STD included in the dummy stage group STDG is varied, the number of dummy start signal lines and the number of dummy off signal lines for controlling the dummy stages may be varied.

For example, if one dummy stage group STDG is composed of two dummy stages STD, eight dummy stage groups STDG are formed, so that eight dummy start signal lines are required, and two dummy off signal lines corresponding to the two dummy stages STD included in each dummy stage group STDG are required.

Accordingly, the required numbers of dummy start signal lines and dummy off signal lines may be varied by changing the number of dummy stages STD constituting the dummy stage group STDG.

In short, to reduce the number of dummy start signal lines and the number of dummy off signal lines, it is effective to make the number of dummy stage groups STDG identical to the number of dummy stages STD included in the dummy stage group STDG. In other words, when 16 dummy stages are used, 4 dummy stages STD are configured as one dummy stage group STDG, so that the number of dummy start signal lines and the number of dummy off signal lines may be ½ of the number of all the dummy stages STD.

Figure 14:
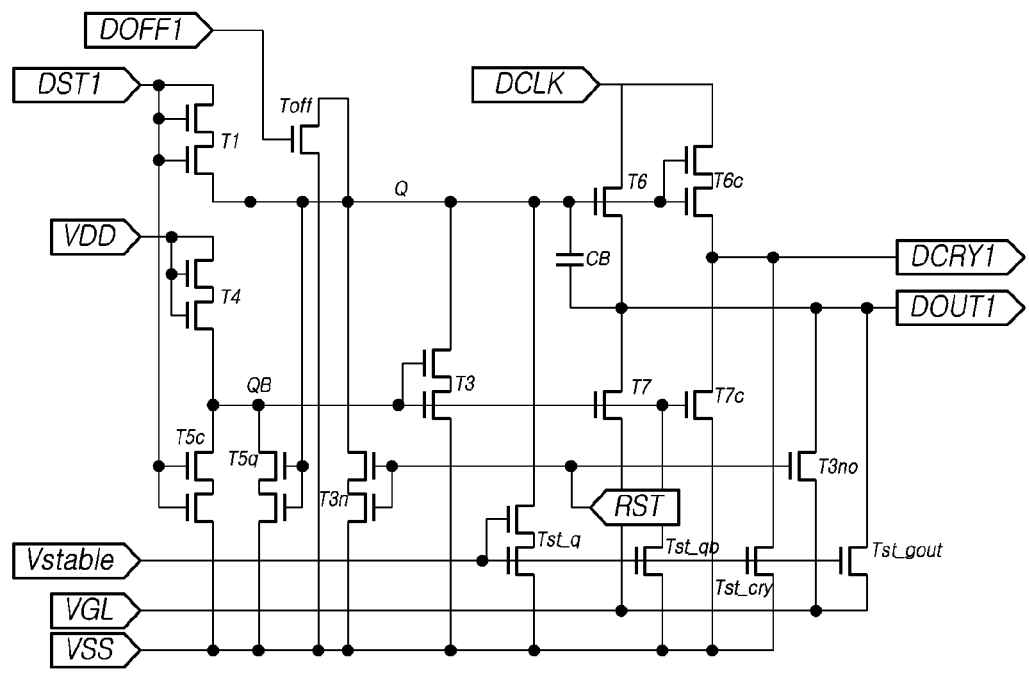
FIG. 14 is a circuit diagram illustrating an example of a dummy stage in a touch display device according to embodiments of the disclosure.

FIG. 14 is a circuit diagram illustrating an example of a dummy stage in a touch display device according to embodiments of the disclosure.

Referring to FIG. 14, in a touch display device 100 according to embodiments of the disclosure, a dummy stage STD1 disposed between two panel blocks PB may include a charge transistor T1 and a discharge transistor Toff for applying a charge voltage to a Q node Q, pull-up transistors T6 and T6c connected to the Q node Q, pull-down transistors T3, T7, and T7c connected to the QB node QB, reset transistors T3n and T3no to discharge the Q node Q by a reset signal RST, and switch circuits T4, T5c, and T5q to control the voltage level of the QB node QB.

Here, the first dummy stage STD1 corresponding to the first touch driving period TP1 is shown as an example. The first dummy stage STD1 to the 16th dummy stage STD16 may have the same internal circuit configuration, except that the timings when the dummy start signal DST and the dummy off signal DOFF are applied are different.

Some of the transistors included in the dummy stage STD1 may be dual-gate transistors T1, T3, T3n, T4, T5c, T5q, T6c, and Tst_q sharing the gate node.

In the dummy stage STD1, there may be one Q node Q and one QB node QB, and each of the Q node Q and the QB node QB is charged by a high-potential voltage VDD or discharged to a low-potential voltage VSS.

The high-potential voltage VDD may be a gate high voltage VGH. The gate low voltage VGL may be applied to the T7 transistor T7 and the T3no transistor T3no to control the level of the dummy output signal DOUT1.

The high-level first dummy start signal DST1 is applied to the first dummy stage STD1 at the time when the first touch driving period TP1 corresponding to the first panel block PB1 ends, and the second display driving period DP2 starts.

The charge transistor T1 is provided with a first dummy start signal DST1 to charge the Q node Q. The Q node Q may be charged up to the gate high voltage VGH.

Further, when the dummy clock DCLK is input to the drain nodes of the pull-up transistors T6 and T6c, the voltage of the Q node Q may increase to a voltage higher than the gate high voltage VGH, e.g., by 2VGH, by bootstrapping. In this case, the pull-up transistors T6 and T6c may be turned on by the voltage of the Q node Q, so that the voltages of the dummy output signal DOUT1 and the dummy carry signal DCRY1 may rise to the level of the gate high voltage VGH. A bootstrapping capacitor CB may be connected between a gate node and a source node (drain node) of the T6 transistor.

The pull-down transistors T7 and T7c may be turned on when the voltage of the QB node QB is charged as much as the gate high voltage VGH to discharge the voltages of the dummy output signal DOUT1 and the dummy carry signal DCRY.

The discharge transistor Toff discharges the voltage of the Q node Q to the low-potential voltage VSS when the dummy off signal DOFF1 is applied.

Accordingly, the dummy stage STD1 may serve to hold the scan signal SCAN from being applied to the display panel 110 during the corresponding touch driving period TP1.

In this case, the dummy stage STD1 may further include stabilization transistors Tst_q, Tst_qb, Tst_cry, and Tst_gout for stabilizing the Q node Q, the QB node QB, the dummy carry signal DCRY1, and the dummy output signal DOUT1 to a low potential voltage VSS or a gate low voltage VGL by a stabilization voltage Vstable. The stabilization transistors Tst_q, Tst_qb, Tst_cry, and Tst_gout may be omitted.

Meanwhile, the gate stage STG may be configured with the same circuit as, or a different circuit from, the dummy stage STD.

If the gate stage STG is configured with the same circuit as the dummy stage STD, it may include a charge transistor and a discharge transistor for applying a charge voltage to the Q node, a pull-up transistor connected to the Q node, a pull-down transistor connected to the QB node, a reset transistor to discharge the Q node by a reset signal, and a switch circuit to control the voltage level of the QB node, and the dummy output signal DOUT may correspond to the scan signal SCAN.

In contrast, the gate stage STG may have a different circuit configuration from that of the dummy stage STD. For example, one gate stage STG may output a plurality of scan signals SCAN in which case the gate stage STG may be configured to output a plurality of scan signals by a plurality of scan clock signals.

One example configuration of the dummy stage STD has been described herein, but the circuit configurations of the dummy stage STD and gate stage STG may be varied.

Figure 15:
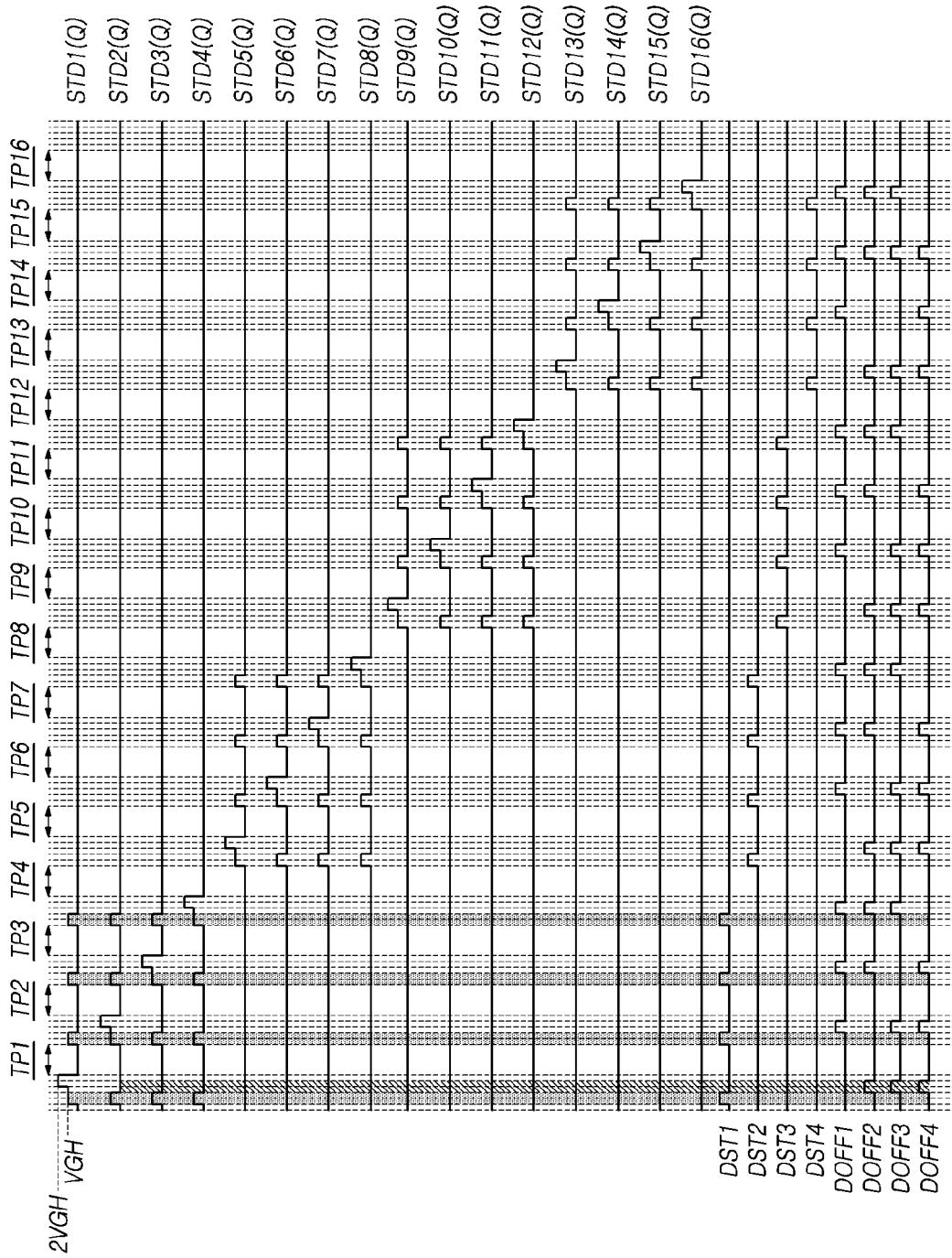
FIG. 15 is a view illustrating examples of a dummy start signal and a dummy off signal for controlling a dummy stage and a waveform at a Q node of the dummy stage in a touch display device according to embodiments of the disclosure.

FIG. 15 is a view illustrating examples of a dummy start signal and a dummy off signal for controlling a dummy stage and a waveform at a Q node of the dummy stage in a touch display device according to embodiments of the disclosure.

Referring to FIG. 15, in the touch display device 100 according to embodiments of the disclosure, the plurality of dummy stages STD1 to STD16 constituting the gate driving circuit 120 are divided into groups, and the dummy stages STD1 to STD16 may be sequentially controlled on a basis of group, by the dummy start signal DST and the dummy off signal DOFF.

For example, 16 dummy stages STD1 to STD16 may be divided into 4 dummy stage groups STDG1 to STDG4), and 4 dummy stages STD may be disposed in each dummy stage group STDG1 to STDG4.

Before the first display drive period DP1 corresponding to the first panel block PB1 ends and the first touch drive period TP1 begins, a first dummy start signal DST1 of a high level is applied to turn on the first dummy stage STD1.

In this case, the first dummy start signal DST1 is simultaneously applied to the first dummy stage STD1 to the fourth dummy stage STD4 included in the first dummy stage group STDG1, so that the charge transistors T1 constituting the first dummy stage STD1 to the fourth dummy stage STD4 are turned on together. However, the second dummy off signal DOFF2 to the fourth dummy off signal DOFF4 for turning off the second dummy stage STD2 to the fourth dummy stage STD4 when the first dummy start signal DST1 are applied together. As a result, the discharge transistors Toff constituting the second dummy stage STD2 to the fourth dummy stage STD4 are turned on, discharging the Q node Q. Accordingly, only the first dummy stage STD1 generates the dummy output signal DOUT1 and the dummy carry signal DCRY1 before the first touch driving period TP1 begins.

When the first touch driving period TP1 ends, the second display driving period DP2 corresponding to the second panel block PB2 proceeds, and before the second touch driving period TP2 begins, the first dummy off signal DOFF1, the third dummy off signal DOFF3, and the fourth dummy off signal DOFF4, together with the first dummy start signal DST1, are applied at the high level to turn on the second dummy stage STD2.

Through this process, the first dummy stage STD1 to the 16th dummy stage STD16 may be sequentially driven to respectively correspond to the first touch driving period TP1 to the 16th touch driving period TP16.

In this case, to sequentially turn on the first dummy stage STD1 to the 16th dummy stage ST16, four dummy start signals DST1 to DST4 and four dummy off signals DOFF1 to DOFF4 are required. Therefore, it is possible to simplify the layout of the bezel area and reduce the width of the bezel area.

Figure 16:
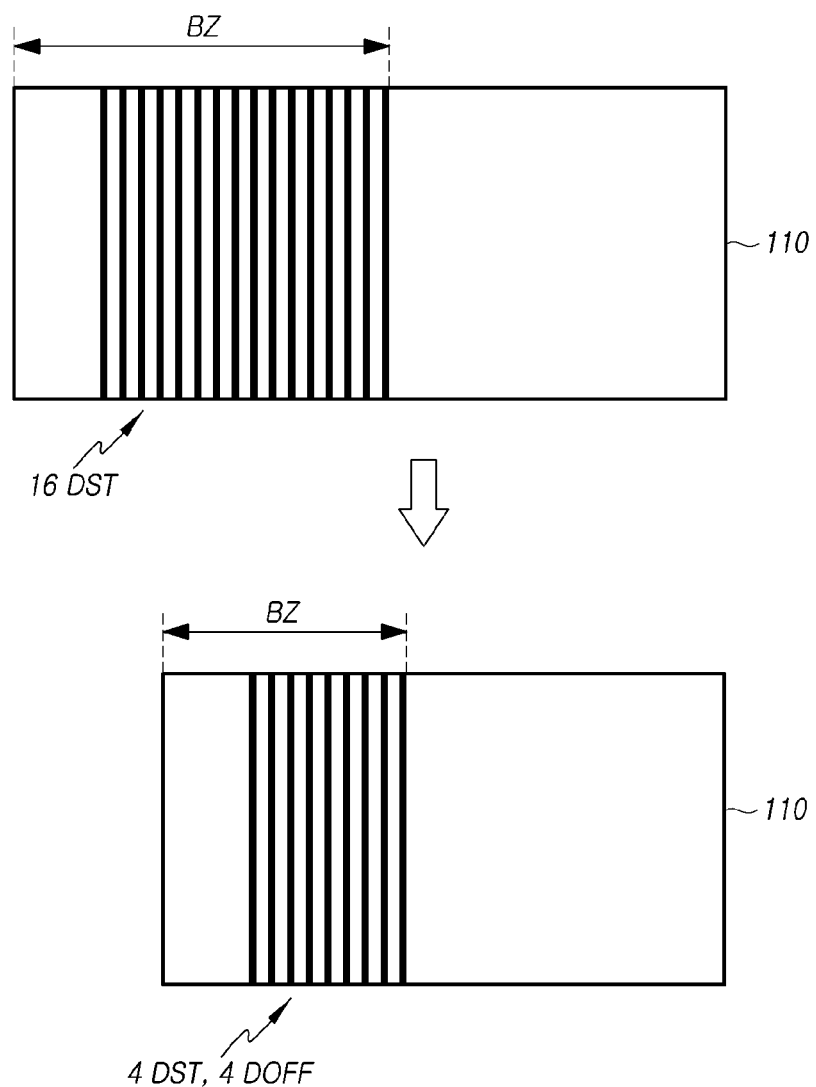
FIG. 16 is a view illustrating an example of reducing the layout and width of the bezel area by controlling a plurality of dummy stages using a dummy start signal line and a dummy off signal line in a touch display device according to embodiments of the disclosure.

FIG. 16 is a view illustrating an example of reducing the layout and width of the bezel area by controlling a plurality of dummy stages using a dummy start signal line and a dummy off signal line in a touch display device according to embodiments of the disclosure.

Referring to FIG. 16, when the touch display device 100 according to embodiments of the disclosure operates in an LHB driving manner including 16 display driving periods DP1 to DP16 and 16 touch driving periods TP1-TP16, only four dummy start signal lines and four dummy off signal lines may be required to control the gate driving circuit 120 in which the 16 dummy stages STD1 to STD16 are arranged.

Accordingly, the width of the bezel area BZ may be reduced by about ½ as compared to when 16 dummy start signal lines are disposed to control the 16 dummy stages STD1 to STD16.

Above, since the dummy start signal DST corresponds to a signal for controlling the dummy stage group STDG, the dummy start signal DST may be regarded as a group control signal of the dummy stage, and the dummy start signal line may be regarded as a group control signal line. On the other hand, since the dummy off signal DOFF corresponds to a signal for controlling the individual dummy stages STD disposed in the dummy stage group STDG, the dummy off signal DOFF may be regarded as an individual control signal of the dummy stage, and the dummy off signal line may be regarded as an individual control signal line.

Meanwhile, the touch display device 100 of the disclosure may also be configured to connect the dummy start signal DST and the dummy select signal on a basis of group and to turn on the dummy stage STD where the dummy start signal DST and the dummy select signal are simultaneously applied at a high level.

Figure 17:
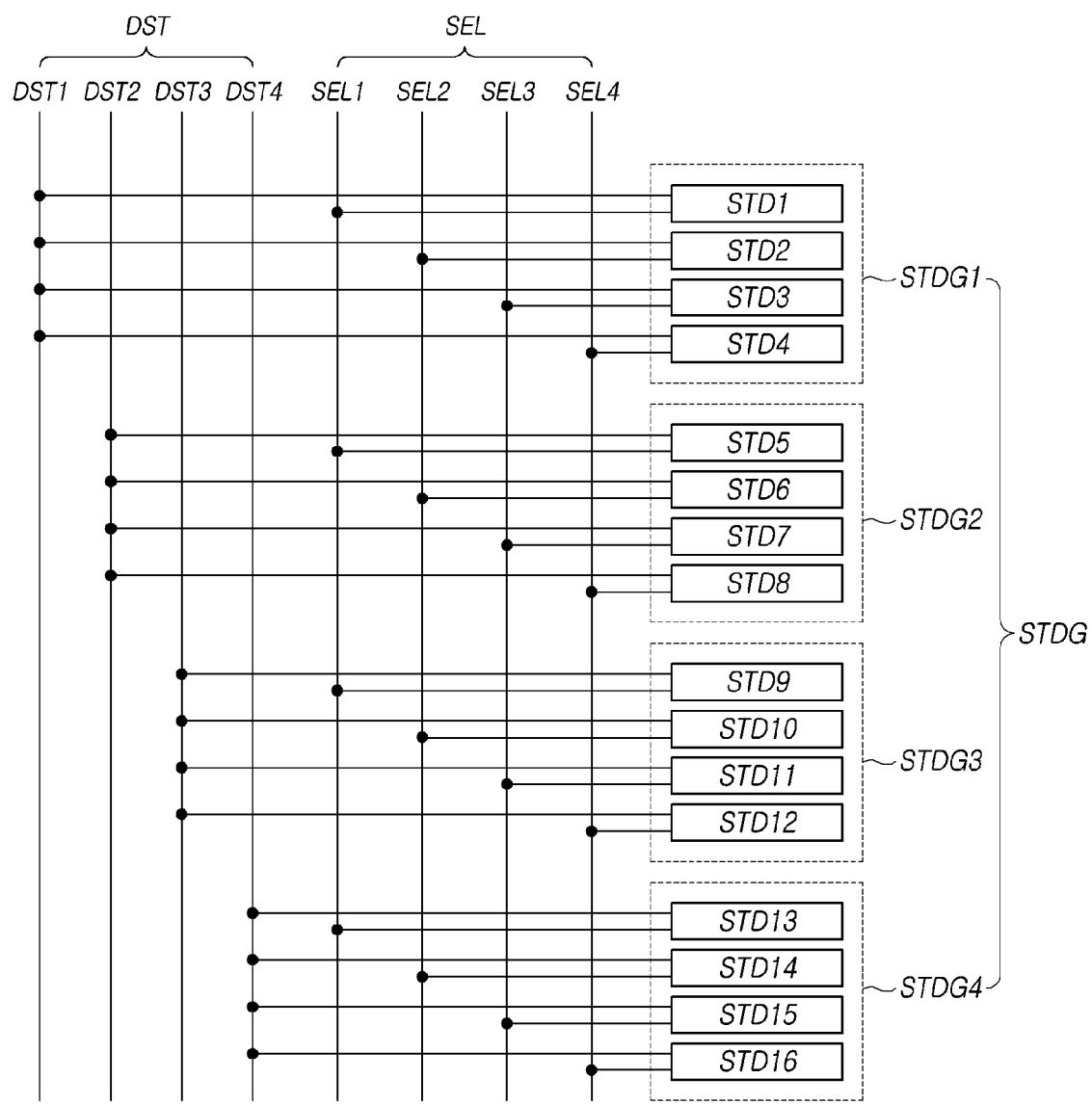
FIG. 17 is a view illustrating an example of a layout of signal lines for applying dummy start signals and dummy select signals to dummy stages in a touch display device according to embodiments of the disclosure.

FIG. 17 is a view illustrating an example of a layout of signal lines for applying dummy start signals and dummy select signals to dummy stages in a touch display device according to embodiments of the disclosure.

Referring to FIG. 17, in the touch display device 100 according to embodiments of the disclosure, the plurality of dummy stages STD1 to STD16 constituting the gate driving circuit 120 are divided into groups, and the dummy stages STD1 to STD16 may be sequentially controlled by the dummy start signal DST and the dummy off signal SEL applied on a basis of group.

For example, 16 dummy stages STD1 to STD16 may be divided into 4 dummy stage groups STDG1 to STDG4), and 4 dummy stages STD may be disposed in each dummy stage group STDG1 to STDG4.

In other words, the first dummy stage STD1 to the fourth dummy stage STD4 are disposed in the first dummy stage group STDG1, and the fifth dummy stage STD5 to eighth dummy stage STD8 are disposed in the second dummy stage group STDG2. Further, the ninth dummy stage STD9 to 12th dummy stage STD12 are disposed in the third dummy stage group STDG3, and the 13th dummy stage STD13 to 16th dummy stage STD16 are disposed in the fourth dummy stage group STDG4.

In this state, the first dummy start signal line for applying the first dummy start signal DST1 is connected to all of the first dummy stage STD1 to the fourth dummy stage STD4 included in the first dummy stage group STDG1. Accordingly, the first dummy stage STD1 to the fourth dummy stage STD4 included in the first dummy stage group STDG1 may be simultaneously driven by the first dummy start signal DST1.

Further, the second dummy start signal line for applying the second dummy start signal DST2 is connected to all of the fifth dummy stage STD5 to the eighth dummy stage STD8 included in the second dummy stage group STDG2. Accordingly, the fifth dummy stage STD5 to the eighth dummy stage STD8 included in the second dummy stage group STDG2 may be simultaneously driven by the second dummy start signal DST2.

Further, the third dummy start signal line for applying the third dummy start signal DST3 is connected to all of the ninth dummy stage STD9 to twelfth dummy stage STD12 included in the third dummy stage group STDG3. Accordingly, the ninth dummy stage STD9 to 16th dummy stage STD16 included in the third dummy stage group STDG3 may be simultaneously driven by the third dummy start signal DST3.

Further, the fourth dummy start signal line for applying the fourth dummy start signal DST4 is connected to all of the thirteenth dummy stage STD13 to the sixteenth dummy stage STD16 included in the fourth dummy stage group STDG4. Accordingly, the thirteenth dummy stage STD13 to the sixteenth dummy stage STD16 included in the fourth dummy stage group STDG4 may be simultaneously driven by the fourth dummy start signal DST4.

Meanwhile, the first dummy select signal line for transferring the first dummy select signal SEL1 is simultaneously connected to the respective first dummy stages STD1, STD5, STD9 and STD13 of the dummy stage groups STDG1 to STDG4, and the second dummy select signal line for transferring the second dummy select signal SEL2 is simultaneously connected to the respective second dummy stages STD2, STD6, STD10 and STD14 of the dummy stage groups STDG1 to STDG4.

Further, the third dummy select signal line for transferring the third dummy select signal SEL3 is simultaneously connected to the respective third dummy stages STD3, STD7, STD11, and STD15 of the dummy stage groups STDG1 to STDG4, and the fourth dummy select signal line for transferring the fourth dummy select signal SEL4 is simultaneously connected to the respective fourth dummy stages STD4, STD8, STD12, and STD16 of the dummy stage groups STDG1 to STDG4.

In this state, each dummy stage STD is configured to be driven only when the dummy start signal DST and the dummy select signal SEL are simultaneously applied at the high level.

For example, when the first dummy start signal DST1 and the first dummy select signal SEL1 are applied at the high level, only the first dummy stage STD1 where the first dummy start signal DST1 and the first dummy select signal SEL1 are simultaneously applied may be driven.

Accordingly, when the first dummy start signal DST1 is applied at the high level, but only the first dummy select signal SEL1 is applied at the high level while the second through fourth dummy select signals SEL2 to SEL4 are applied at the low level, only the first dummy stage STD1 may be driven.

Similarly, when only the first dummy start signal DST1 and the second dummy select signal SEL2 are applied at the high level, only the second dummy stage STD2 may be driven.

In other words, the operation of each dummy stage STD1 to STD16 may be individually controlled by using four dummy start signals DST1 to DST4 and four dummy select signals SEL1 to SEL4.

As a result, only 4 dummy start signal lines and 4 dummy select signal lines are required to control the gate driving circuit 120 in which 16 dummy stages STD1 to STD16 are disposed, so that it is possible to simplify the layout of the bezel area and reduce the width of the bezel area.

Meanwhile, when the dummy stage group STDG is composed of 4 dummy stages STD, 4 dummy start signal lines and 4 dummy select signal lines are required to control 16 dummy stages STD1 to STD16. However, if the number of dummy stages STD included in the dummy stage group STDG is varied, the number of dummy start signal lines and the number of dummy select signal lines for controlling the dummy stages may be varied.

For example, if one dummy stage group STDG is composed of two dummy stages STD, eight dummy stage groups STDG are formed, so that eight dummy start signal lines are required, and two dummy select signal lines corresponding to the two dummy stages STD included in each dummy stage group STDG are required.

Accordingly, the required numbers of dummy start signal lines and dummy select signal lines may be varied by changing the number of dummy stages STD constituting the dummy stage group STDG.

In short, to reduce the number of dummy start signal lines and the number of dummy select signal lines, it is effective to make the number of dummy stage groups STDG identical to the number of dummy stages STD included in the dummy stage group STDG. In other words, when 16 dummy stages are used, 4 dummy stages STD are configured as one dummy stage group STDG, so that the number of dummy start signal lines and the number of dummy select signal lines may be ½ of the number of all the dummy stages STD.

In this case, the dummy select signal line may be configured as a demultiplexer that branches signals according to the number of dummy select signals SEL1 to SEL4.

Figure 18:
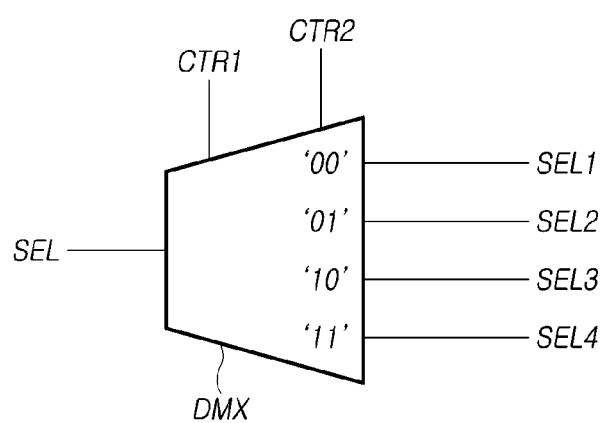
FIG. 18 is a view illustrating an example of a demultiplexer generating a dummy select signal in a touch display device according to embodiments of the disclosure.

FIG. 18 is a view illustrating an example of a demultiplexer generating a dummy select signal in a touch display device according to embodiments of the disclosure.

Referring to FIG. 18, in the touch display device 100 according to embodiments of the disclosure, four dummy select signals SEL1 to SEL4 may be generated by a 1:4 demultiplexer DMX.

In this case, when the 1:4 demultiplexer DMX is used, since the dummy select signal SEL may be branched through four dummy select signal lines, the dummy select signal SEL may be selected by two control signals CTR1 and CTR2.

For example, when both the first control signal CTR1 and the second control signal CTR2 are applied at the low level ('00'), the demultiplexer DMX may transfer the dummy select signal SEL through the first dummy select signal line. Accordingly, the high-level first dummy select signal SEL1 may be transferred to the dummy stage to which the first dummy select signal line is connected.

In contrast, when the first control signal CTR1 is applied at the low level and the second control signal CTR2 is applied at the high level ('01'), the demultiplexer DMX may transfer the dummy select signal SEL through the second dummy select signal line. Accordingly, in this case, the high-level second dummy select signal SEL2 may be transferred to the dummy stage to which the second dummy select signal line is connected.

As such, the demultiplexer DMX may be used to deliver the dummy select signal SEL when the dummy stages STD are grouped, and the dummy stage STD where the dummy start signal DST and the dummy select signal SEL are applied simultaneously at the high level may be turned on.

Figure 19:
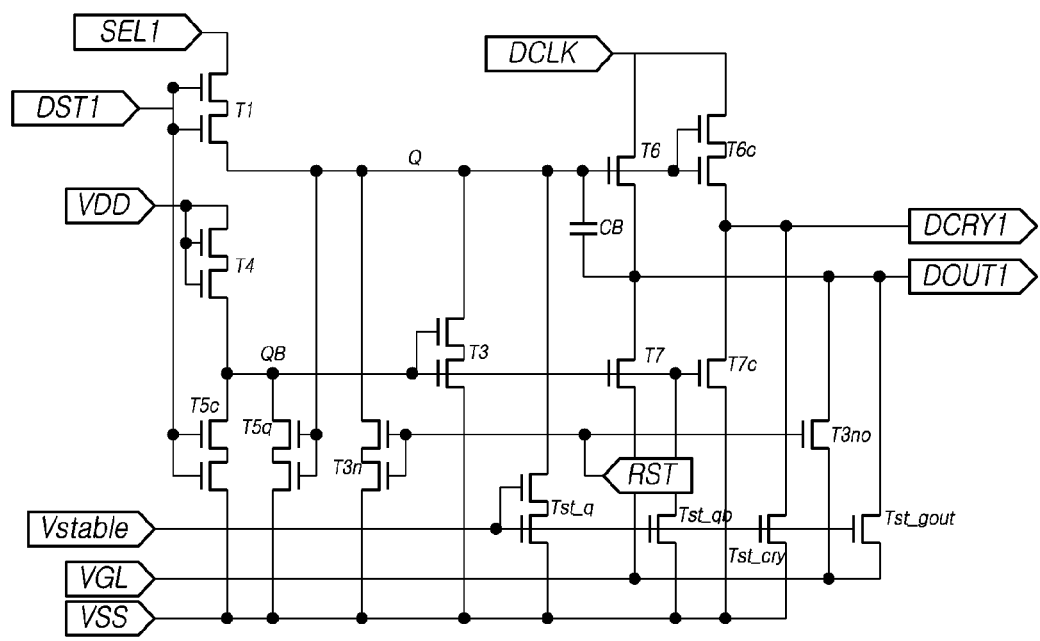
FIG. 19 is a circuit diagram illustrating an example of a dummy stage controlling operations using a dummy start signal and a dummy select signal in a touch display device according to embodiments of the disclosure.

FIG. 19 is a circuit diagram illustrating an example of a dummy stage controlling operations using a dummy start signal and a dummy select signal in a touch display device according to embodiments of the disclosure.

Referring to FIG. 19, in a touch display device 100 according to embodiments of the disclosure, a dummy stage STD1 disposed between two panel blocks PB may include a charge transistor T1 for charging a Q node Q, pull-up transistors T6 and T6c connected to the Q node Q, pull-down transistors T3, T7, and T7c connected to the QB node QB(N), reset transistors T3n and T3no to discharge the Q node Q by a reset signal RST, and switch circuits T4, T5c, and T5q to control the voltage level of the QB node QB.

Here, the first dummy stage STD1 corresponding to the first touch driving period TP1 is shown as an example. The first dummy stage STD1 to the 16th dummy stage STD16 may have the same internal circuit configuration, except that the timings when the dummy start signal DST and the dummy select signal SEL are applied are different.

Some of the transistors included in the dummy stage STD1 may be dual-gate transistors T1, T3, T3n, T4, T5c, T5q, T6c, and Tst_q sharing the gate node.

In the dummy stage STD1, there may be one Q node Q and one QB node QB, and each of the Q node Q and the QB node QB is charged by a high-potential voltage VDD or discharged to a low-potential voltage VSS.

The high-potential voltage VDD may be a gate high voltage VGH, and the gate low voltage VGL may be applied to the T7 transistor T7 and the T3no transistor T3no to control the level of the dummy output signal DOUT1.

The high-level first dummy start signal DST1 and first dummy select signal SEL1 are applied to the first dummy stage STD1 at the time when the first touch driving period TP1 corresponding to the first panel block PB1 ends, and the second display driving period DP2 starts.

Since the first dummy start signal DST1 and the first dummy select signal SEL1, respectively, are applied to the gate node and the drain node of the charge transistor T1, the charge transistor T1 is turned on to charge the Q node Q when the first dummy start signal DST1 and the first dummy select signal SEL1 are applied to the high level. The Q node Q may be charged up to the gate high voltage VGH.

In an alternative configuration, the first dummy start signal DST1 may be applied to the drain node of the charge transistor T1, and the first dummy select signal SEL1 may be applied to the gate node of the charge transistor T1.

Further, when the dummy clock DCLK is input to the drain nodes of the pull-up transistors T6 and T6c, the voltage of the Q node Q may increase to a voltage higher than the gate high voltage VGH, e.g., by 2VGH, by bootstrapping. In this case, the pull-up transistors T6 and T6c may be turned on by the voltage of the Q node Q, so that the voltages of the dummy output signal DOUT1 and the dummy carry signal DCRY1 may rise to the level of the gate high voltage VGH. A bootstrapping capacitor CB may be connected between a gate node and a source node (drain node) of the T6 transistor.

The pull-down transistors T7 and T7c may be turned on when the voltage of the QB node QB is charged as much as the gate high voltage VGH to discharge the voltages of the dummy output signal DOUT1 and the dummy carry signal DCRY.

Accordingly, the dummy stage STD1 may serve to hold the scan signal SCAN from being applied to the display panel 110 during the corresponding touch driving period TP1.

In this case, the dummy stage STD1 may further include stabilization transistors Tst_q, Tst_qb, Tst_cry, and Tst_gout for stabilizing the Q node Q, the QB node QB, the dummy carry signal DCRY1, and the dummy output signal DOUT1 to a low potential voltage VSS or a gate low voltage VGL by a stabilization voltage Vstable. The stabilization transistors Tst_q, Tst_qb, Tst_cry, and Tst_gout may be omitted.

Figure 20:
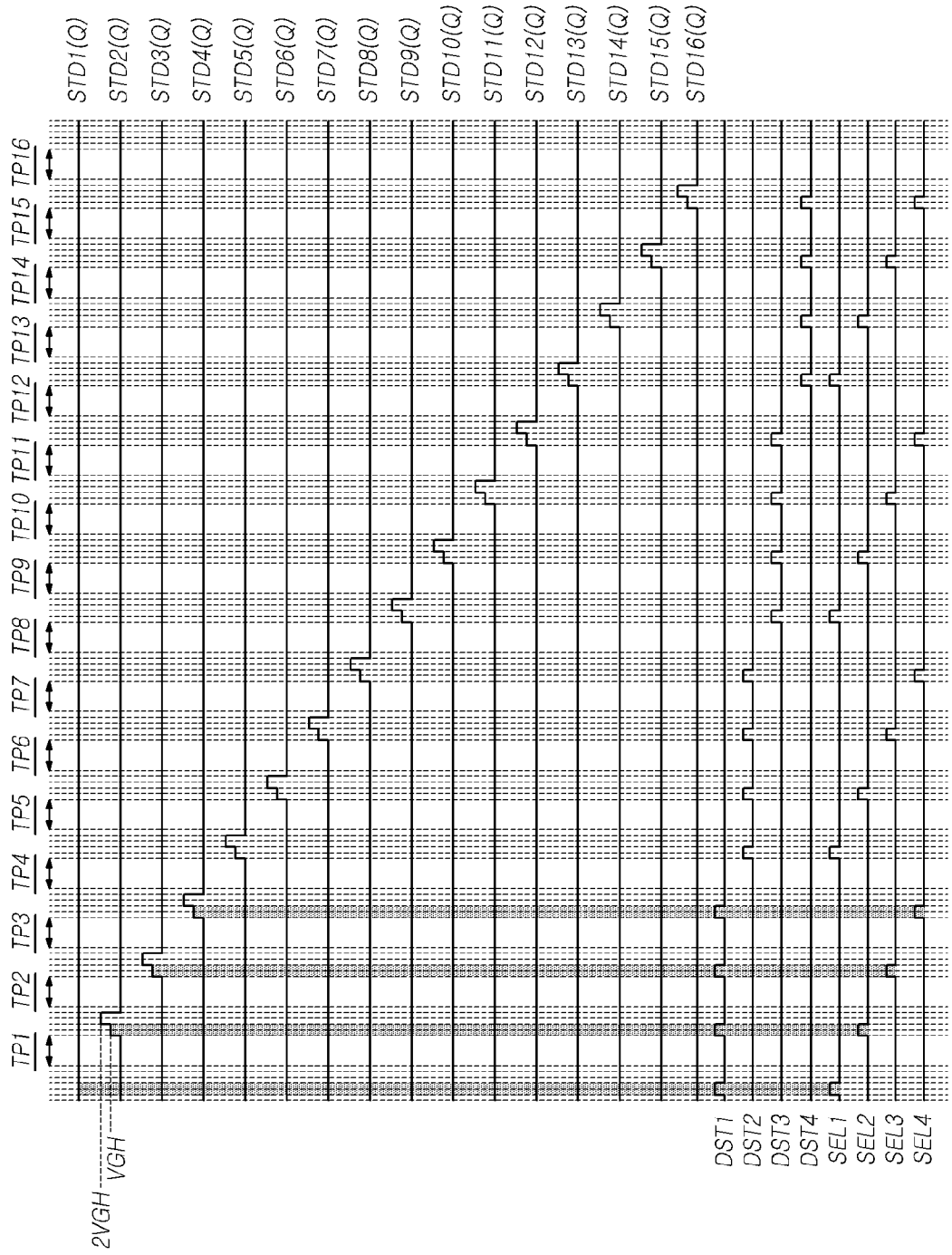
FIG. 20 is a view illustrating examples of a dummy start signal and a dummy select signal for controlling a dummy stage and a waveform at a Q node of the dummy stage in a touch display device according to embodiments of the disclosure.

FIG. 20 is a view illustrating examples of a dummy start signal and a dummy select signal for controlling a dummy stage and a waveform at a Q node of the dummy stage in a touch display device according to embodiments of the disclosure.

Referring to FIG. 20, in the touch display device 100 according to embodiments of the disclosure, the plurality of dummy stages STD1 to STD16 constituting the gate driving circuit 120 are divided into groups, and the dummy start signal DST is applied on a basis of group simultaneously with sequentially controlling the dummy stages STD1 to STD16 using the dummy select signal SEL.

For example, 16 dummy stages STD1 to STD16 may be divided into 4 dummy stage groups STDG1 to STDG4, and 4 dummy stages STD may be disposed in each dummy stage group STDG1 to STDG4.

Before the first display drive period DP1 corresponding to the first panel block PB1 ends and the first touch drive period TP1 begins, a first dummy start signal DST1 and a first dummy start signal DST1 are applied, at the high level, to turn on the first dummy stage STD1.

When the first touch driving period TP1 ends, the second display driving period DP2 corresponding to the second panel block PB2 proceeds, and before the second touch driving period TP2 begins, the first dummy start signal DST1 and the second dummy select signal SEL2 are applied at the high level to turn on the second dummy stage STD2.

Through this process, the first dummy stage STD1 to the 16th dummy stage STD16 may be sequentially turned on to respectively correspond to the first touch driving period TP1 to the 16th touch driving period TP16.

In this case, to sequentially turn on the first dummy stage STD1 to the 16th dummy stage ST16, four dummy start signals DST1 to DST4 and four dummy select signals SEL1 to SEL4 are required. Therefore, it is possible to simplify the layout of the bezel area and reduce the width of the bezel area.

Above, since the dummy start signal DST corresponds to a signal for controlling the dummy stage group STDG, the dummy start signal DST may be regarded as a group control signal of the dummy stage, and the dummy start signal line may be regarded as a group control signal line. On the other hand, since the dummy select signal SEL corresponds to a signal for controlling the individual dummy stages STD disposed in the dummy stage group STDG, the dummy select signal SEL may be regarded as an individual control signal of the dummy stage, and the dummy off signal line may be regarded as an individual control signal line.

Embodiments of the disclosure described above are briefly described below.

A touch display device 100 according to the disclosure may comprise a display panel 110 having a plurality of subpixels SP, a gate driving circuit including a plurality of gate stages STG for applying a scan signal SCAN to the display panel 110 through a plurality of gate lines GL and a plurality of dummy stages STD selectively disposed between the plurality of gate stages STG, and a touch driving circuit 150 applying a touch driving signal to the display panel 110 through a plurality of touch lines and receiving a touch sensing signal generated by the display panel 110. The plurality of dummy stages STD may be divided into two or more dummy stage groups STDG. A group control signal line for applying a group control signal on a basis of dummy stage group and an individual control signal line for applying an individual control signal to each dummy stage included in the dummy stage group STDG may be disposed along a bezel area BZ.

The number of the dummy stage groups STDG and the number of the dummy stages STD belonging to the dummy stage group STDG may be configured to be the same.

The group control signal may be a dummy start signal for turning on a selected dummy stage group STDG. The individual control signal may be a dummy off signal for turning off a dummy stage selected from among a plurality of dummy stages STD included in the dummy stage group STDG.

The dummy stage may include a charge transistor T1 charging a Q node Q by the dummy start signal, a discharge transistor Toff discharging the Q node Q by the dummy off signal DOFF, a pull-up transistor T6 or T6c connected to the Q node Q, a pull-down transistor T3, T7, or T7c connected to a QB node QB, a reset transistor T3n or T3no discharging the Q node Q by a reset signal RST, and a switch circuit T4, T5c, or T5q controlling a voltage level of the QB node QB.

The dummy stage may further include a stabilization transistor Tst_q, Tst_qb, Tst_cry, or Tst_gout for stabilizing the Q node Q and the QB node QB.

The group control signal may be a dummy start signal for turning on a selected dummy stage group STDG. The individual control signal may be a dummy select signal SEL for turning on a dummy stage STD selected from among a plurality of dummy stages STD included in the dummy stage group STDG.

The dummy stage STD may include a charge transistor T1 charging a Q node Q by the dummy start signal DST and the dummy select signal SEL, a pull-up transistor T6 or T6c connected to the Q node Q, a pull-down transistor T3, T7, or T7c connected to a QB node QB, a reset transistor T3n or T3no discharging the Q node Q by a reset signal RST, and a switch circuit T4, T5c, or T5q controlling a voltage level of the QB node QB.

The dummy select signal SEL may be applied through a demultiplexer DMX branching into a plurality of dummy select signal lines to be connected to a designated dummy stage STD.

A display panel 110 according to the disclosure may comprise a plurality of subpixels SP, and a gate driving circuit 120 positioned in a bezel area BZ and including a plurality of gate stages STG for applying a scan signal SCAN to a plurality of subpixels SP through a plurality of gate lines GL and a plurality of dummy stages STD selectively disposed between the plurality of gate stages STG. A group control signal line for applying a group control signal on a basis of dummy stage group and an individual control signal line for applying an individual control signal to each dummy stage STD included in the dummy stage group STDG may be disposed along the bezel area BZ.

A gate driving circuit 120 according to the disclosure may comprise a plurality of gate stages STG for applying a scan signal SCAN to a display panel 110 through a plurality of gate lines GL and a plurality of dummy stages STD selectively disposed between the plurality of gate stages STG. The dummy stage STD may include a charge transistor T1 charging a Q node Q by the dummy start signal, a discharge transistor Toff discharging the Q node Q by the dummy off signal DOFF, a pull-up transistor T6 or T6c connected to the Q node Q, a pull-down transistor T3, T7, or T7c connected to a QB node QB, a reset transistor T3n or T3no discharging the Q node Q by a reset signal RST, and a switch circuit T4, T5c, or T5q controlling a voltage level of the QB node QB.

A gate driving circuit 120 according to the disclosure may comprise a plurality of gate stages STG for applying a scan signal SCAN to a display panel 110 through a plurality of gate lines GL and a plurality of dummy stages STD selectively disposed between the plurality of gate stages STG. The plurality of dummy stages STD may include a charge transistor T1 charging a Q node Q by a dummy start signal and a dummy select signal SEL, a pull-up transistor T6 or Tc connected to the Q node Q, a pull-down transistor T3, T7, or T7c connected to a QB node QB, a reset transistor T3n or T3no discharging the Q node Q by a reset signal RST, and a switch circuit T4, T5c, or T5q controlling a voltage level of the QB node QB.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

What is claimed:

1. A touch display device, comprising:
a display panel including a plurality of subpixels;
a gate driving circuit including a plurality of gate stage blocks each including a plurality of gate stages configured to apply a plurality of scan signals to the display panel through a plurality of gate lines, and M (M is a natural number greater than 1) dummy stage groups each selectively disposed between the plurality of gate stage blocks; and
a touch driving circuit configured to apply a plurality of touch driving signals to the display panel through a plurality of touch lines and receive a plurality of touch sensing signals generated by the display panel,
wherein each of the M dummy stage groups has N (N is a natural number greater than or equal to 2) dummy stages,
wherein a plurality of group control signal lines that apply concurrently a plurality of group control signals to the N dummy stages and a plurality of individual control signal lines that apply concurrently a plurality of individual control signals to Kth (K is a natural number from 1 to N) dummy stage included in the M dummy stage groups are disposed along a bezel area of the display panel,
wherein the plurality of gate stage blocks includes at least first, second, third, and fourth gate stage blocks, which are sequentially disposed in the gate driving circuit,
wherein a first dummy stage is disposed between the first and second gate stage blocks, a second dummy stage is disposed between the second and third gate stage blocks, a third dummy stage is disposed between the third and fourth gate stage blocks, and a fourth dummy stage is disposed to follow the fourth gate stage blocks,
wherein the M dummy stage groups includes at least a first dummy stage group including the first and second dummy stages and a second dummy stage group including the third and fourth dummy stages,
wherein a first group control signal line among the plurality of group control signal lines is directly electrically connected to the first and second dummy stages without being electrically connected to the first, second, third, and fourth gate stage blocks, and a second group control signal line among the plurality of group control signal lines is directly electrically connected to the third and fourth dummy stages without being electrically connected to the first, second, third, and fourth gate stage blocks, and
wherein a first individual control signal line among the plurality of individual control signal lines is directly electrically connected to any one of the first and second dummy stages included in the first dummy stage group and any one of the third and fourth dummy stages included in the second dummy stage group, and a second individual control signal line among the plurality of individual control signal lines is directly electrically connected to the other one of the first and second dummy stages included in the first dummy stage group and the other one of the third and fourth dummy stages included in the second dummy stage group.

2. The touch display device of claim 1, wherein a number of dummy stage groups and a number of the dummy stages included in one dummy stage group are the same.

3. The touch display device of claim 1, wherein each of the plurality of group control signals is a dummy start signal that turn on a selected dummy stage group, and
wherein each of the plurality of individual control signals is a dummy off signal that turn off a dummy stage selected from among the N dummy stages included in each dummy stage group.

4. The touch display device of claim 3, wherein each of the N dummy stages includes:
a charge transistor configured to charge a Q node by a dummy start signal among the plurality of dummy start signals;
a discharge transistor configured to discharge the Q node by a dummy off signal among the plurality of dummy off signals;
a pull-up transistor connected to the Q node;
a pull-down transistor connected to a QB node;
a reset transistor configured to discharge the Q node by a reset signal; and
a switch circuit configured to control a voltage level of the QB node.

5. The touch display device of claim 4, wherein each of the N dummy stages further includes a stabilization transistor configured to stabilize the Q node and the QB node.

6. The touch display device of claim 1, wherein each of the plurality of group control signals is a dummy start signal that turn on a selected dummy stage group, and
wherein each of the plurality of individual control signals is a dummy select signal that turn on a dummy stage selected from among the N dummy stages included in each dummy stage group.

7. The touch display device of claim 6, wherein each of the N dummy stages includes:
a charge transistor configured to charge a Q node by a dummy start signal among the plurality of dummy start signals and a dummy select signal among the plurality of dummy select signals;
a pull-up transistor connected to the Q node;
a pull-down transistor connected to a QB node;
a reset transistor configured to discharge the Q node by a reset signal; and
a switch circuit configured to control a voltage level of the QB node.

8. The touch display device of claim 7, wherein each of the N dummy stages further includes a stabilization transistor configured to stabilize the Q node and the QB node.

9. The touch display device of claim 6, wherein the dummy select signal is applied through a demultiplexer branching a plurality of dummy select signal lines to be connected to a designated dummy stage.

10. The touch display device of claim 1, wherein the plurality of group control signal lines and the plurality of individual control signal lines are internal to the gate driving circuit.

11. A display panel, comprising:
a plurality of subpixels; and
a gate driving circuit positioned in a bezel area of the display panel, the gate driving circuit including a plurality of gate stage blocks each including a plurality of gate stages configured to apply a plurality of scan signals to the plurality of subpixels through a plurality of gate lines, and M (M is a natural number greater than 1) dummy stage groups each selectively disposed between the plurality of gate stage blocks,
wherein each of the M dummy stage groups has N (N is a natural number greater than or equal to 2) dummy stages,
wherein a plurality of group control signal lines that apply concurrently a plurality of group control signals to the N dummy stages and a plurality of individual control signal lines that apply concurrently a plurality of individual control signals to Kth (K is a natural number from 1 to N) dummy stage included in the M dummy stage groups are disposed along the bezel area,
wherein the plurality of gate stage blocks includes at least first, second, third, and fourth gate stage blocks, which are sequentially disposed in the gate driving circuit,
wherein a first dummy stage is disposed between the first and second gate stage blocks, a second dummy stage is disposed between the second and third gate stage blocks, a third dummy stage is disposed between the third and fourth gate stage blocks, and a fourth dummy stage is disposed to follow the fourth gate stage blocks,
wherein the M dummy stage groups includes at least a first dummy stage group including the first and second dummy stages and a second dummy stage group including the third and fourth dummy stages,
wherein a first group control signal line among the plurality of group control signal lines is directly electrically connected to the first and second dummy stages without being electrically connected to the first, second, third, and fourth gate stage blocks, and a second group control signal line among the plurality of group control signal lines is directly electrically connected to the third and fourth dummy stages without being electrically connected to the first, second, third, and fourth gate stage blocks, and
wherein a first individual control signal line among the plurality of individual control signal lines is directly electrically connected to any one of the first and second dummy stages included in the first dummy stage group and anyone of the third and fourth dummy stages included in the second dummy stage group, and a second individual control signal line among the plurality of individual control signal lines is directly electrically connected to the other one of the first and second dummy stages included in the first dummy stage group and the other one of the third and fourth dummy stages included in the second dummy stage group.

12. The display panel of claim 11, wherein a number of dummy stage groups and a number of the dummy stages included in one dummy stage group are the same.

13. The display panel of claim 11, wherein each of the plurality of group control signal is a dummy start signal that turn on a selected dummy stage group, and
wherein each of the plurality of individual control signals is a dummy off signal that turn off a dummy stage selected from among the N dummy stages included in each dummy stage group.

14. The display panel of claim 13, wherein each of the N dummy stages includes:
a charge transistor configured to charge a Q node by a dummy start signal among the plurality of dummy start signals;
a discharge transistor configured to discharge the Q node by a dummy off signal among the plurality of dummy off signals;
a pull-up transistor connected to the Q node;
a pull-down transistor connected to a QB node;
a reset transistor configured to discharge the Q node by a reset signal; and
a switch circuit configured to control a voltage level of the QB node.

15. The display panel of claim 11, wherein each of the plurality of group control signals is a dummy start signal that turn on a selected dummy stage group, and wherein each of the plurality of individual control signals is a dummy select signal that turn on a dummy stage selected from among the N dummy stages included in the each dummy stage group.

16. The display panel of claim 15, wherein the dummy select signal is applied through a demultiplexer branching a plurality of dummy select signal lines to be connected to a designated dummy stage.

17. A gate driving circuit, comprising:

a plurality of gate stage blocks each including a plurality of gate stages configured to apply a plurality of scan signals to a display panel through a plurality of gate lines; and M (M is a natural number greater than 1) dummy groups each selectively disposed between the plurality of gate stage blocks, wherein a plurality of group control signal lines are configured to deliver a plurality of group control signals to the M dummy stages, and a plurality of individual control signal lines are configured to deliver a plurality of individual control signals to Kth (K is a natural number from 1 to N) dummy stage included in the M dummy stage groups, wherein each of the M dummy stage groups has N (N is a natural number greater than or equal to 2) dummy stages, wherein each of the plurality of dummy stages includes:
 a charge transistor configured to charge a Q node by a dummy start signal;
 a discharge transistor configured to discharge the Q node by a dummy off signal;
 a pull-up transistor connected to the Q node;
 a pull-down transistor connected to a QB node;
 a reset transistor configured to discharge the Q node by a reset signal; and
 a switch circuit configured to control a voltage level of the QB node, wherein the dummy start signal is applied concurrently to the N dummy stages, wherein the dummy off signal is applied concurrently to the Kth dummy stage included in the M dummy stage groups, wherein the plurality of gate stage blocks includes at least first, second, third, and fourth gate stage blocks, which are sequentially disposed in the gate driving circuit, wherein a first dummy stage is disposed between the first and second gate stage blocks, a second dummy stage is disposed between the second and third gate stage blocks, a third dummy stage is disposed between the third and fourth gate stage blocks, and a fourth dummy stage is disposed to follow the fourth gate stage blocks, wherein the M dummy stage groups includes at least a first dummy stage group including the first and second dummy stages and a second dummy stage group including the third and fourth dummy stages, wherein a first group control signal line among the plurality of group control signal lines is directly electrically connected to the first and second dummy stages without being electrically connected to the first, second, third, and fourth gate stage blocks, and a second group control signal line among the plurality of group control signal lines is directly electrically connected to the third and fourth dummy stages without being electrically connected to the first, second, third, and fourth gate stage blocks, and wherein a first individual control signal line among the plurality of individual control signal lines is directly electrically connected to any one of the first and second dummy stages included in the first dummy stage group and anyone of the third and fourth dummy stages included in the second dummy stage group, and a second individual control signal line among the plurality of individual control signal lines is directly electrically connected to the other one of the first and second dummy stages included in the first dummy stage group and the other one of the third and fourth dummy stages included in the second dummy stage group.

18. The gate driving circuit of claim 17, wherein each of the N dummy stages further includes a stabilization transistor configured to stabilize the Q node and the QB node.

19. A gate driving circuit, comprising:

a plurality of gate stage blocks each including a plurality of gate stages configured to apply a plurality of scan signals to a display panel through a plurality of gate lines; and M (M is a natural number greater than 1) dummy stage groups each selectively disposed between the plurality of gate stage blocks, wherein a plurality of group control signal lines is configured to deliver a plurality of dummy start signals to the M dummy stages, and a plurality of individual control signal lines is configured to deliver a plurality of individual control signals to Kth (K is a natural number from 1 to N) dummy stage included in the M dummy stage groups, wherein each of the M dummy stage groups has N (N is a natural number greater than or equal to 2) dummy stages, wherein each of the N dummy stages includes:
 a charge transistor configured to charge a Q node by a dummy start signal and a dummy select signal;
 a pull-up transistor connected to the Q node;
 a pull-down transistor connected to a QB node;
 a reset transistor configured to discharge the Q node by a reset signal; and
 a switch circuit configured to control a voltage level of the QB node, wherein the dummy start signal is applied concurrently to the N dummy stages, wherein the dummy select signal is applied concurrently to the Kth dummy stage included in the M dummy stage groups, wherein the plurality of gate stage blocks includes at least first, second, third, and fourth gate stage blocks, which are sequentially disposed in the gate driving circuit, wherein a first dummy stage is disposed between the first and second gate stage blocks, a second dummy stage is disposed between the second and third gate stage blocks, a third dummy stage is disposed between the third and fourth gate stage blocks, and a fourth dummy stage is disposed to follow the fourth gate stage blocks, wherein the M dummy stage groups includes at least a first dummy stage group including the first and second dummy stages and a second dummy stage group including the third and fourth dummy stages, wherein a first group control signal line among the plurality of group control signal lines is directly electrically connected to the first and second dummy stages without being electrically connected to the first, second, third, and fourth gate stage blocks, and a second group control signal line among the plurality of group control signal lines is directly electrically connected to the third and fourth dummy stages without being electrically connected to the first, second, third, and fourth gate stage blocks, and wherein a first individual control signal line among the plurality of individual control signal lines is directly electrically connected to any one of the first and second dummy stages included in the first dummy stage group and anyone of the third and fourth dummy stages included in the second dummy stage group, and a second individual control signal line among the plurality of individual control signal lines is directly electrically connected to the other one of the first and second dummy stages included in the first dummy stage group and the other one of the third and fourth dummy stages included in the second dummy stage group.

20. The gate driving circuit of claim 19, wherein each of the N dummy stages further includes a stabilization transistor configured to stabilize the Q node and the QB node.

* * * * *